(12) United States Patent
Kim et al.

(10) Patent No.: US 10,859,199 B2
(45) Date of Patent: Dec. 8, 2020

(54) DISPLAY APPARATUS

(71) Applicant: LG ELECTRONICS INC., Seoul (KR)

(72) Inventors: Hyunho Kim, Seoul (KR); Seokhun Na, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 620 days.

(21) Appl. No.: 15/706,450

(22) Filed: Sep. 15, 2017

(65) Prior Publication Data

US 2018/0112815 A1    Apr. 26, 2018

(30) Foreign Application Priority Data

Oct. 20, 2016    (KR) .................. 10-2016-0136523

(51) Int. Cl.
| | |
|---|---|
| *H04N 7/18* | (2006.01) |
| *F16M 11/04* | (2006.01) |
| *G06F 1/16* | (2006.01) |
| *F16M 13/02* | (2006.01) |
| *F16M 11/10* | (2006.01) |

(Continued)

(52) U.S. Cl.
CPC ......... *F16M 11/046* (2013.01); *F16M 11/041* (2013.01); *F16M 11/045* (2013.01); *F16M 11/10* (2013.01); *F16M 11/38* (2013.01); *F16M 13/022* (2013.01); *G06F 1/1601* (2013.01); *G06F 1/1681* (2013.01); *H05K 7/16* (2013.01);

(Continued)

(58) Field of Classification Search
CPC .... F16M 11/046; F16M 11/38; F16M 11/041; F16M 11/10; F16M 13/022; F16M 11/045; F16M 2200/02; G06F 1/1681; G06F 1/1601; G06F 2200/1612; H05K 7/16
USPC ...................................................... 348/836
See application file for complete search history.

(56) References Cited

U.S. PATENT DOCUMENTS 6,604,722 B1 *   8/2003   Tan ................. F16M 11/10
                                                     248/276.1
9,265,346 B1 *   2/2016   Forney ............ F16M 11/28
(Continued)

FOREIGN PATENT DOCUMENTS

| KR | 1020050111339 | 11/2005 |
|---|---|---|
| KR | 1020100083078 | 7/2010 |

OTHER PUBLICATIONS

PCT International Application No. PCT/KR2017/011627, International Search Report dated Feb. 23, 2018, 3 pages.

*Primary Examiner* — Shan E Elahi
(74) *Attorney, Agent, or Firm* — Lee, Hong, Degerman, Kang & Waimey PC

(57) ABSTRACT

Disclosed is a display apparatus including a display module for displaying an image forward, a link module coupled to the display module so as to be rotatable about a second rotational axis extending in the leftward-rightward direction, and a base module coupled to the link module so as to be rotatable about a first rotational axis extending in the leftward-rightward direction. The base module is configured to have a first state, in which the base module is placed on a floor to support the display module, and a second state, in which the base module is rotated by a predetermined angle from the first state. The first rotational axis is disposed at the rear portion of the base module in the second state. The rear portion faces upward or downward in the first state.

14 Claims, 28 Drawing Sheets

(51) Int. Cl.
*F16M 11/38* (2006.01)
*H05K 7/16* (2006.01)

(52) U.S. Cl.
CPC . *F16M 2200/02* (2013.01); *G06F 2200/1612* (2013.01)

(56) References Cited

U.S. PATENT DOCUMENTS

| | | |
|---|---|---|
| 2008/0001048 A1 | 1/2008 | Woo et al. |
| 2013/0088844 A1* | 4/2013 | Zeng ...................... F16M 11/22 361/808 |

* cited by examiner

[Fig. 1a]
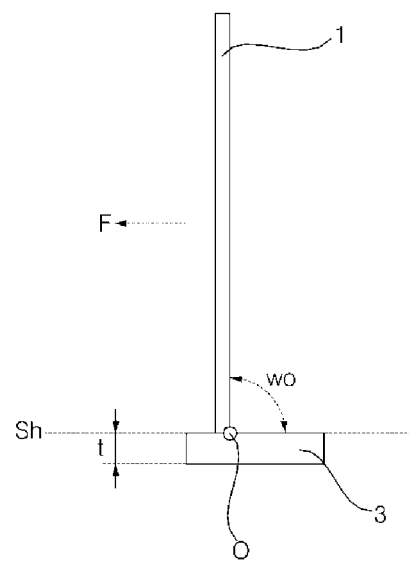
[Fig. 1b]
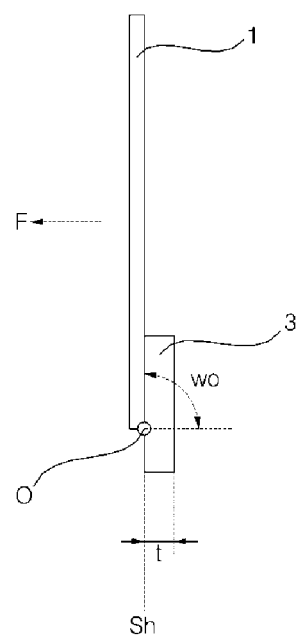

[Fig. 2a]
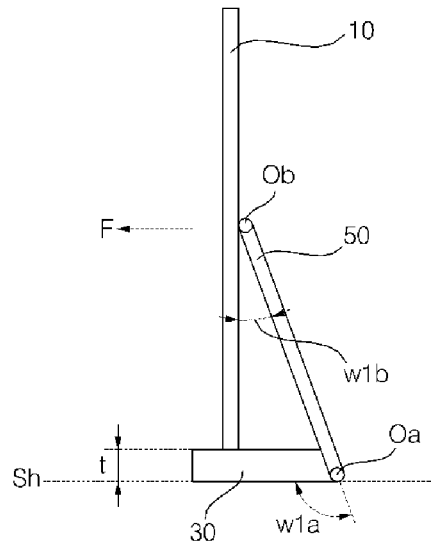
[Fig. 2b]
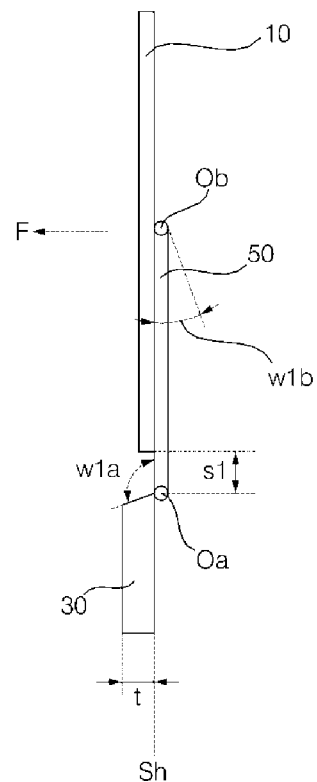

[Fig. 2c]
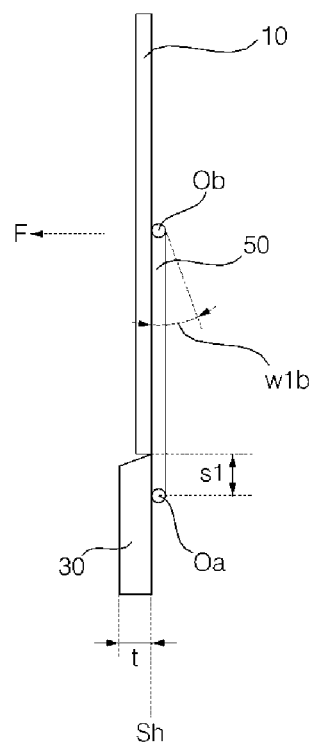

[Fig. 3a]
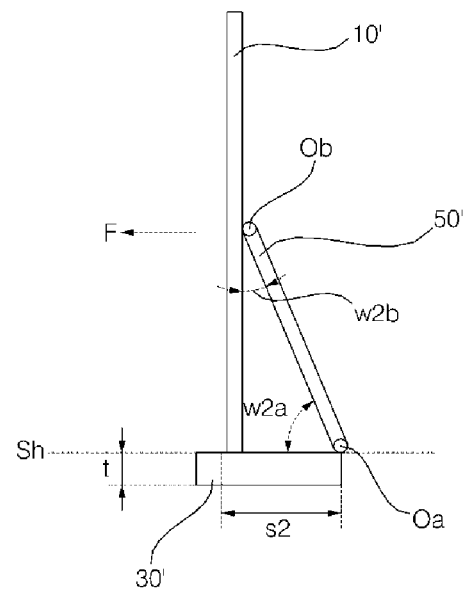
[Fig. 3b]
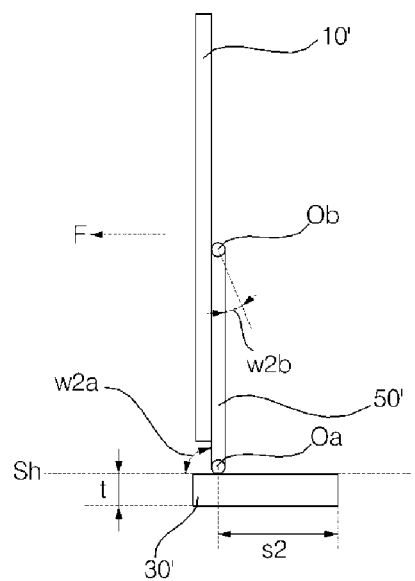

[Fig. 3c]
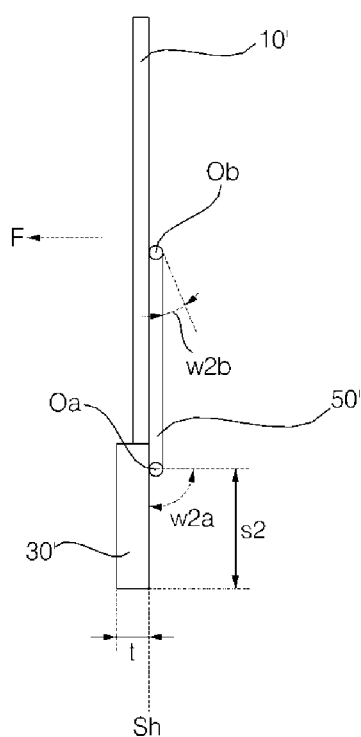

[Fig. 4]
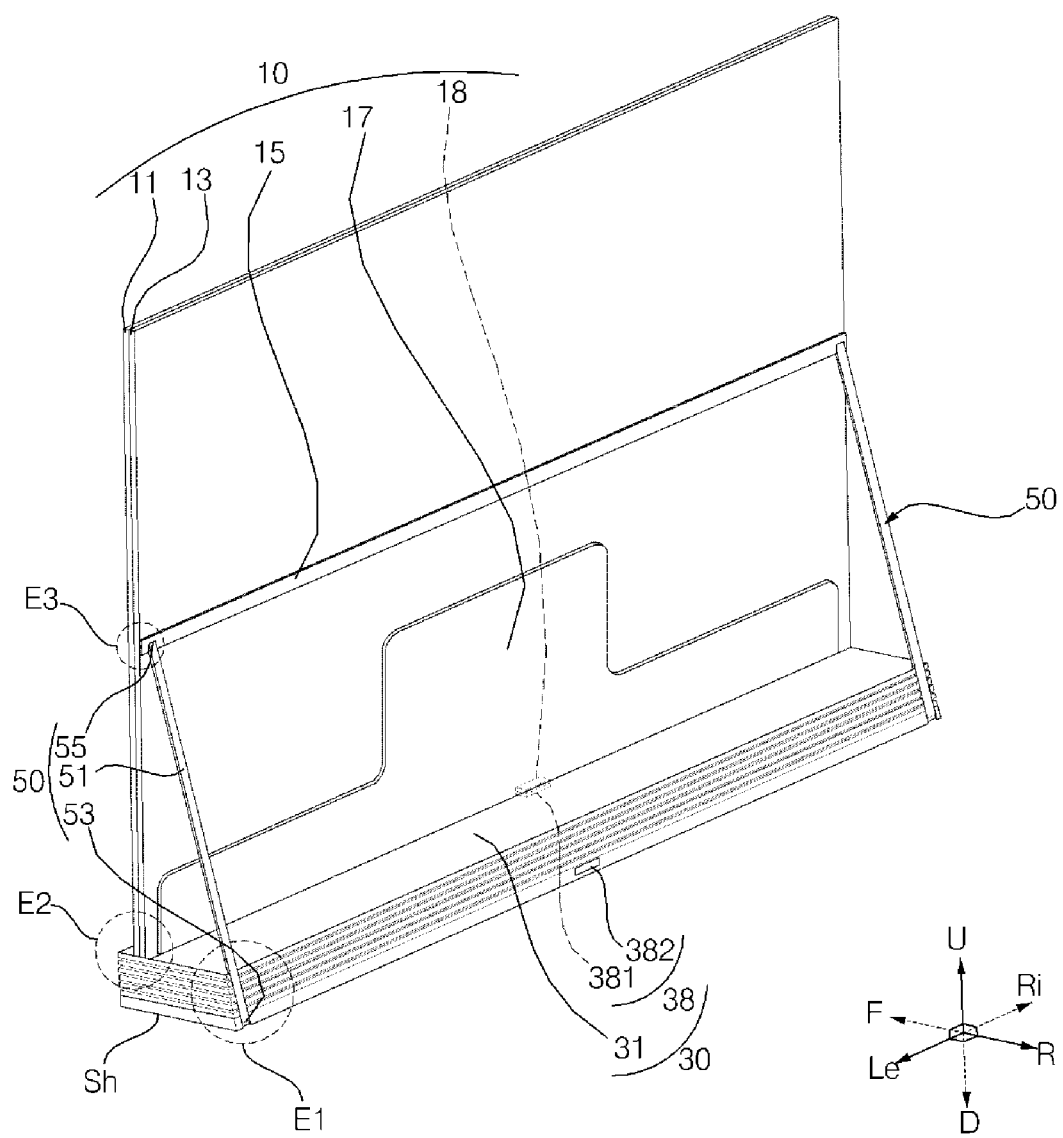

[Fig. 5]
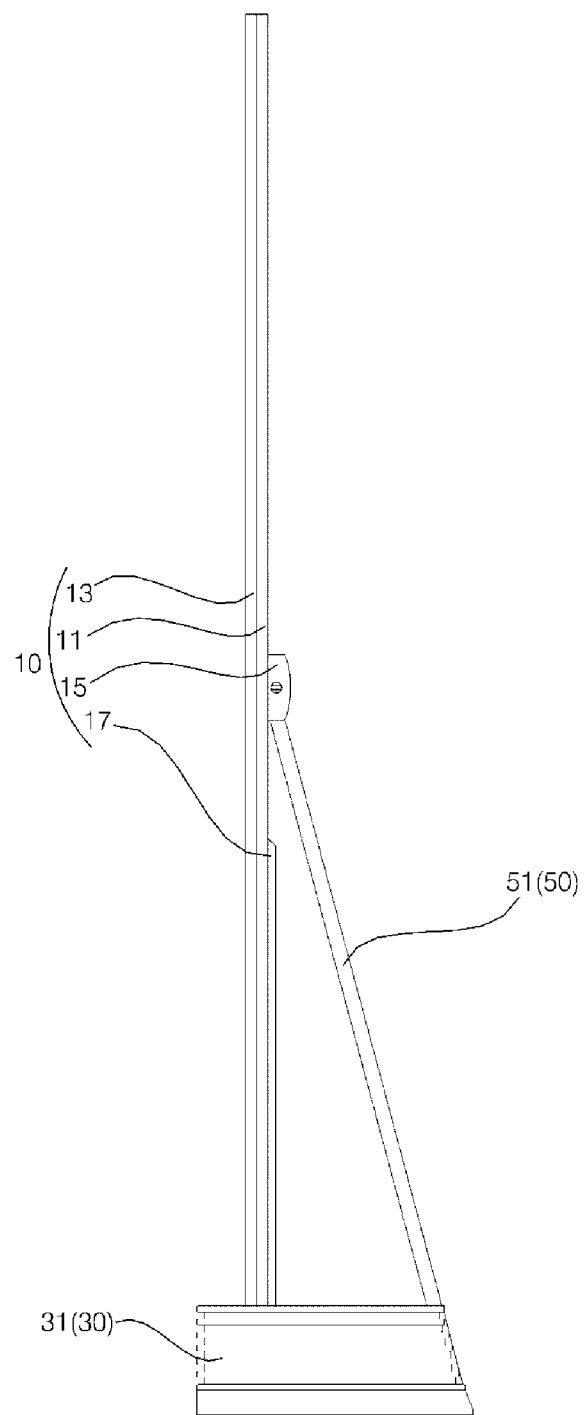

[Fig. 6a]
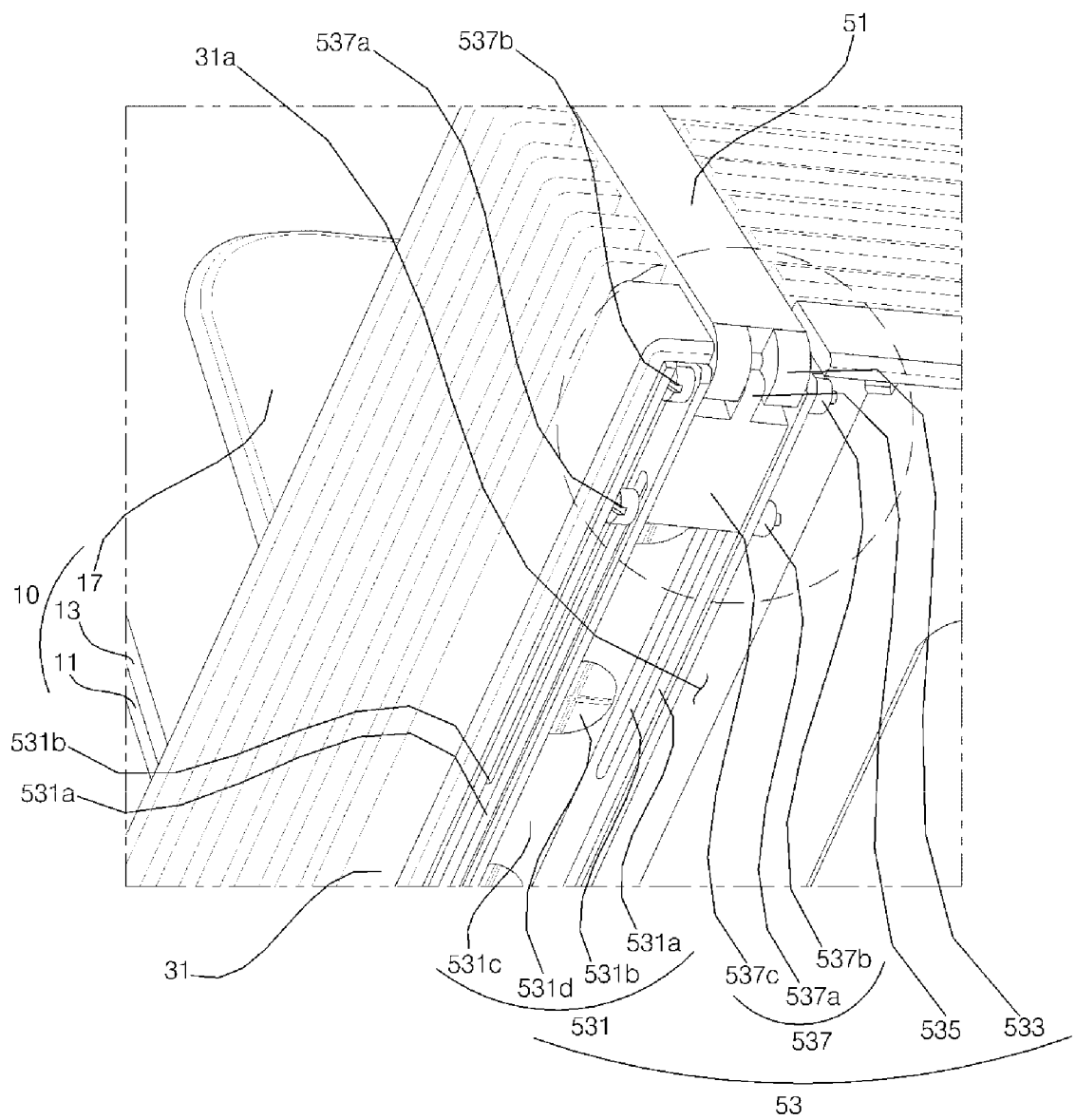

【Fig. 6b】
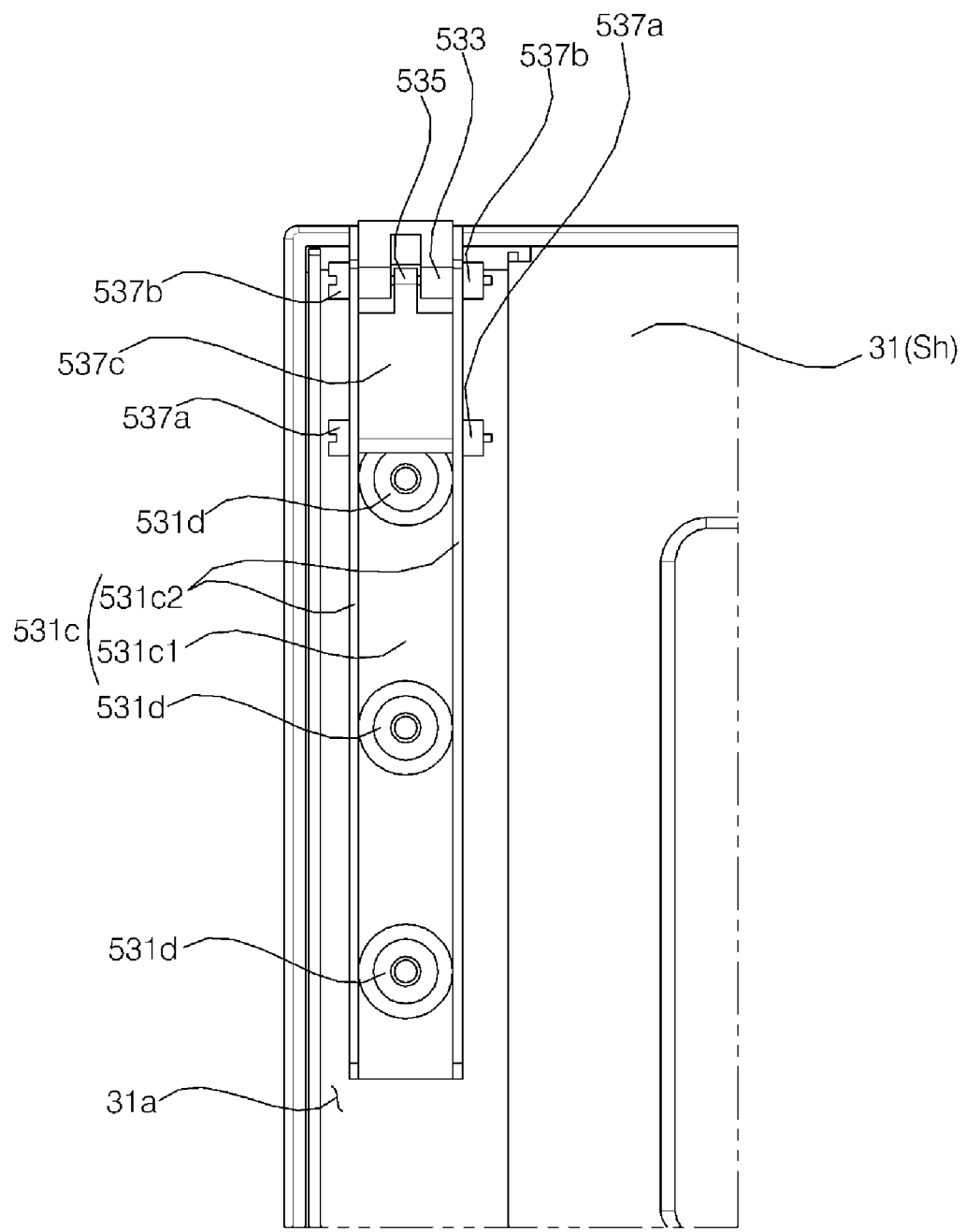

[Fig. 7]
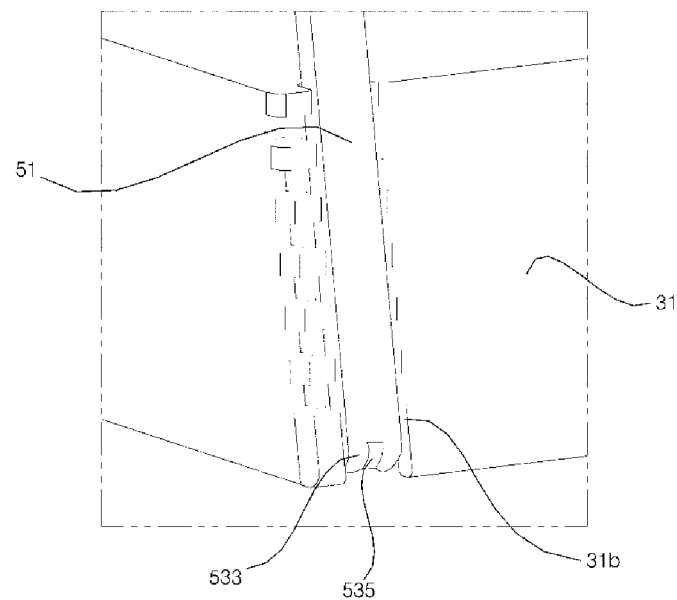
[Fig. 8]
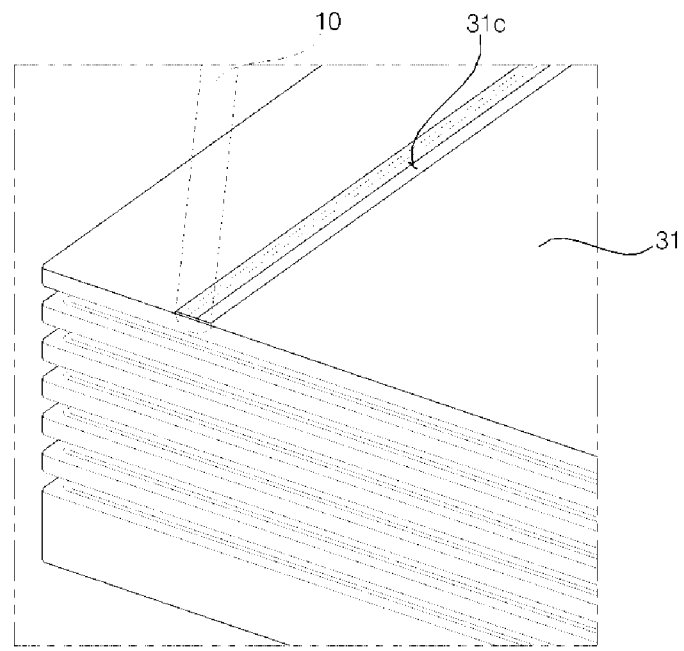

[Fig. 9]
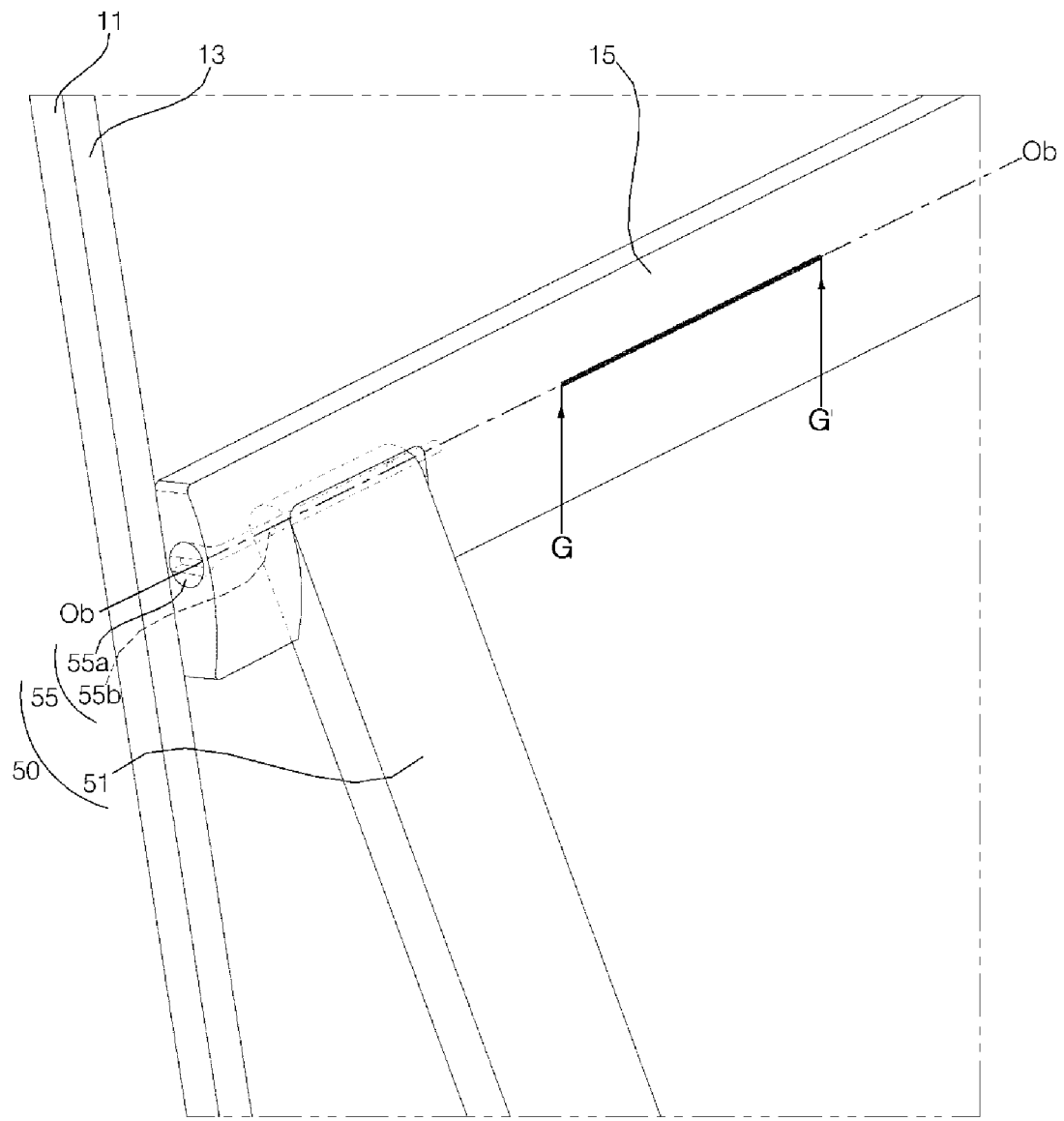

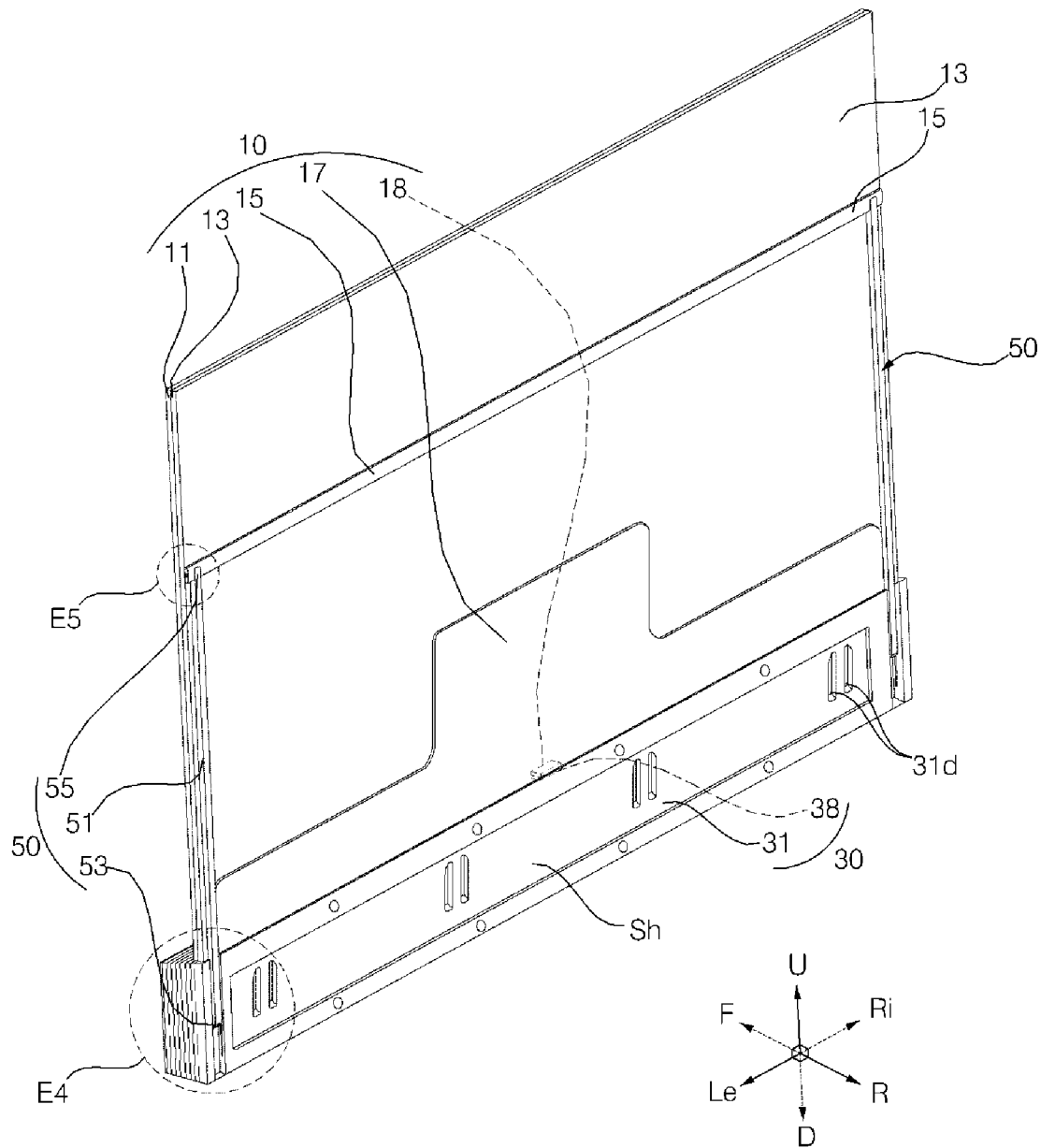
[Fig. 10]

[Fig. 11]
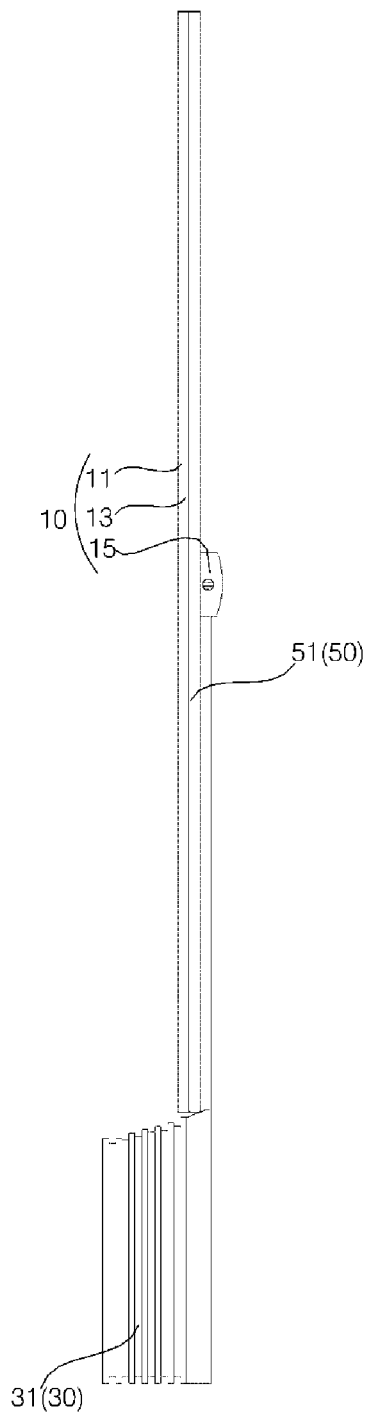

[Fig. 12]
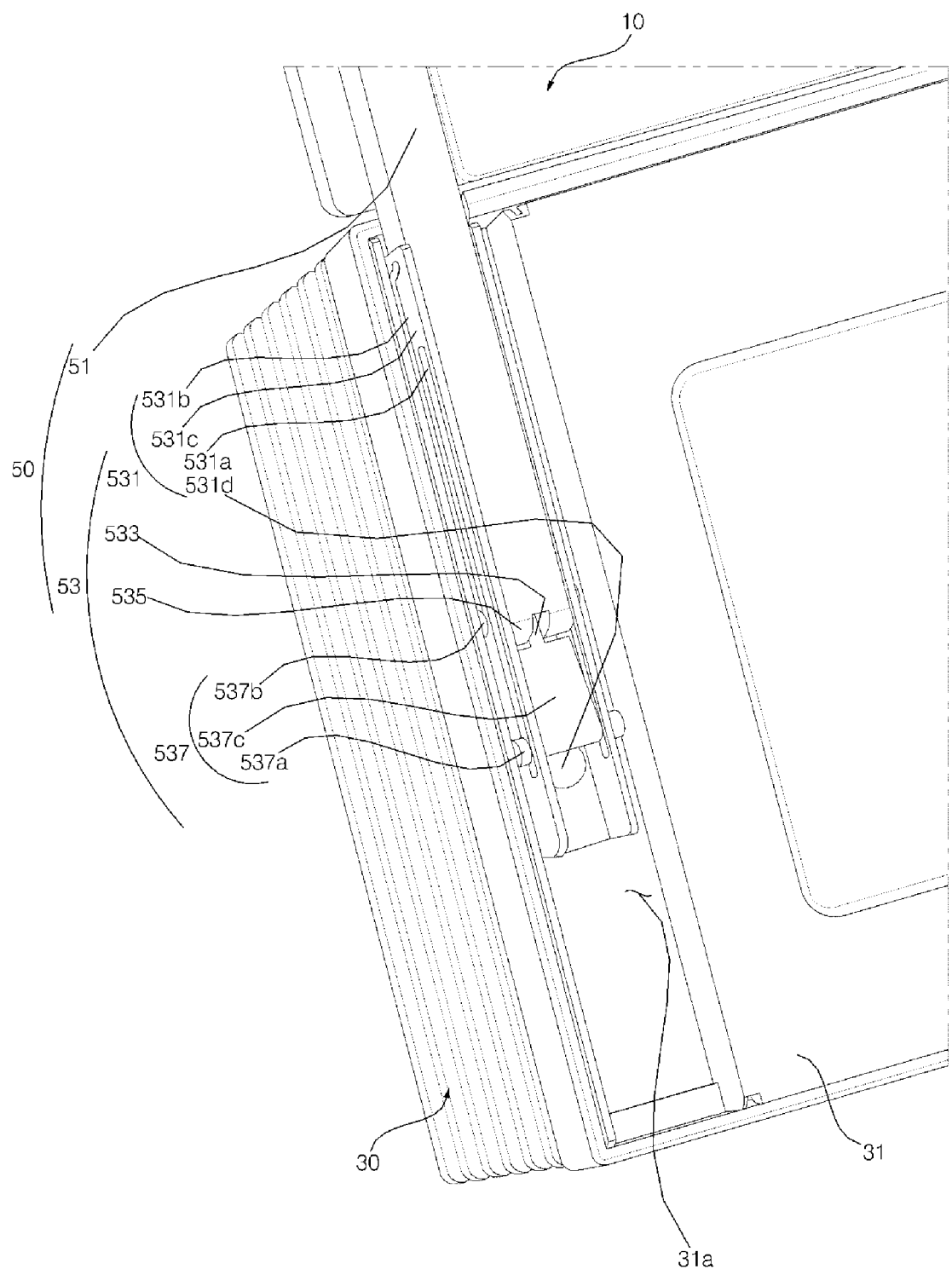

[Fig. 13]
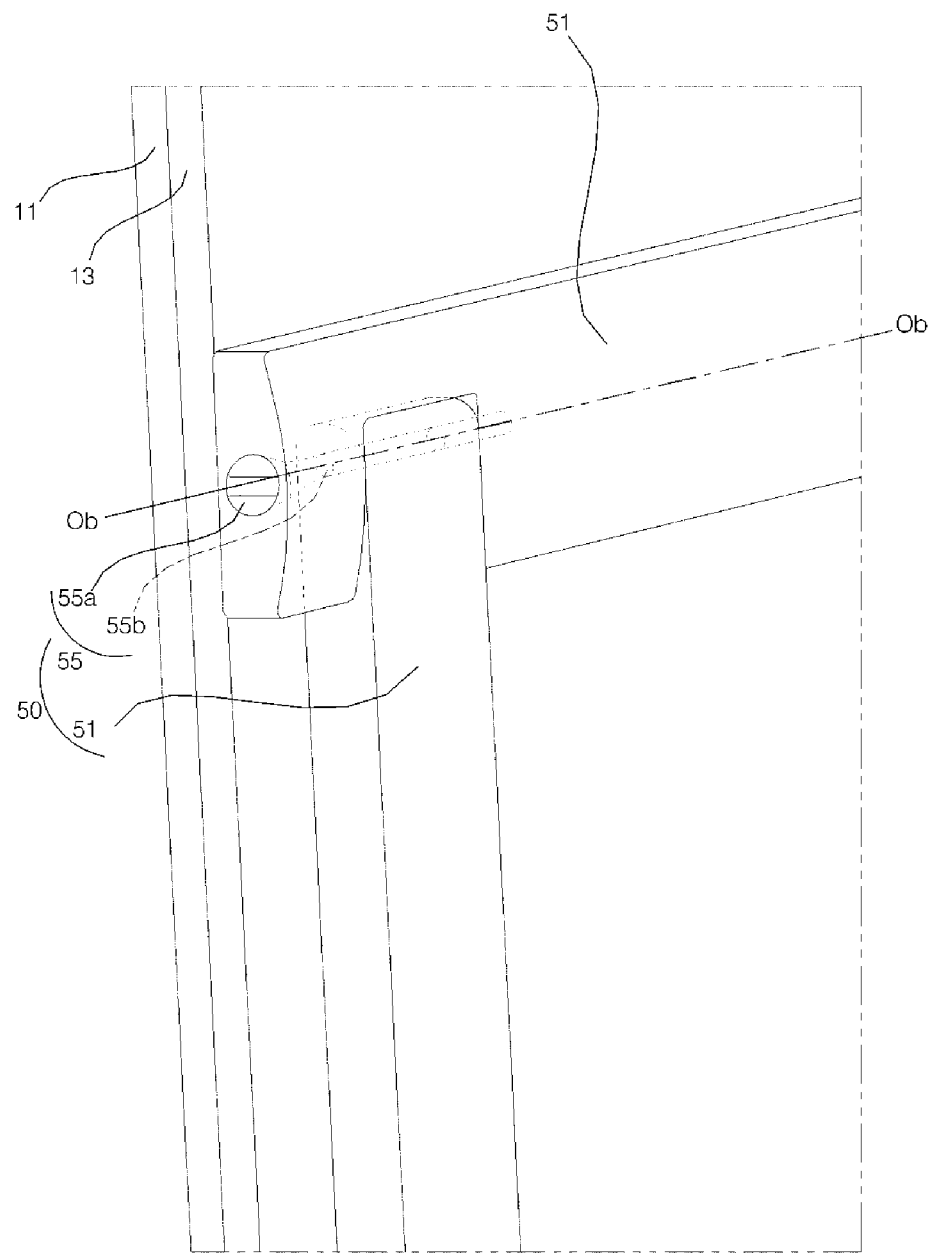

【Fig. 14a】
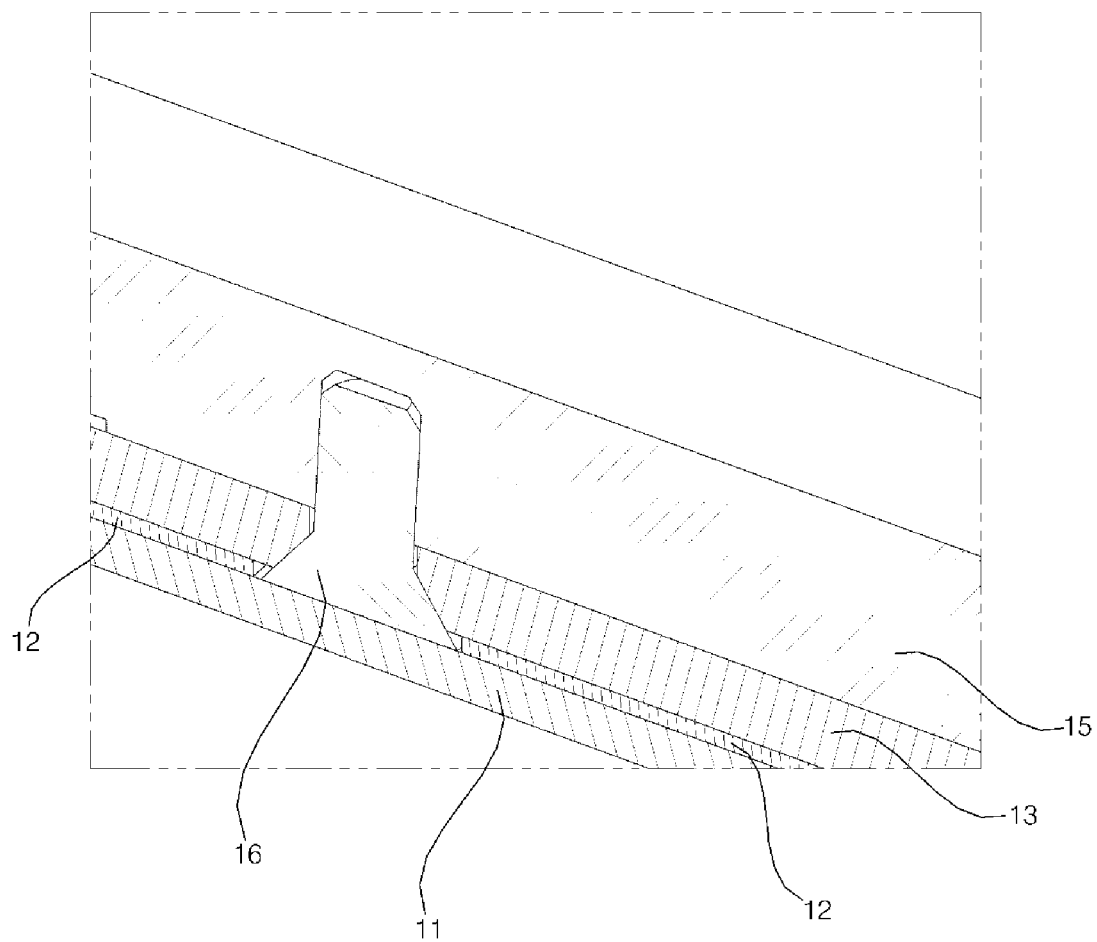

[Fig. 14b]
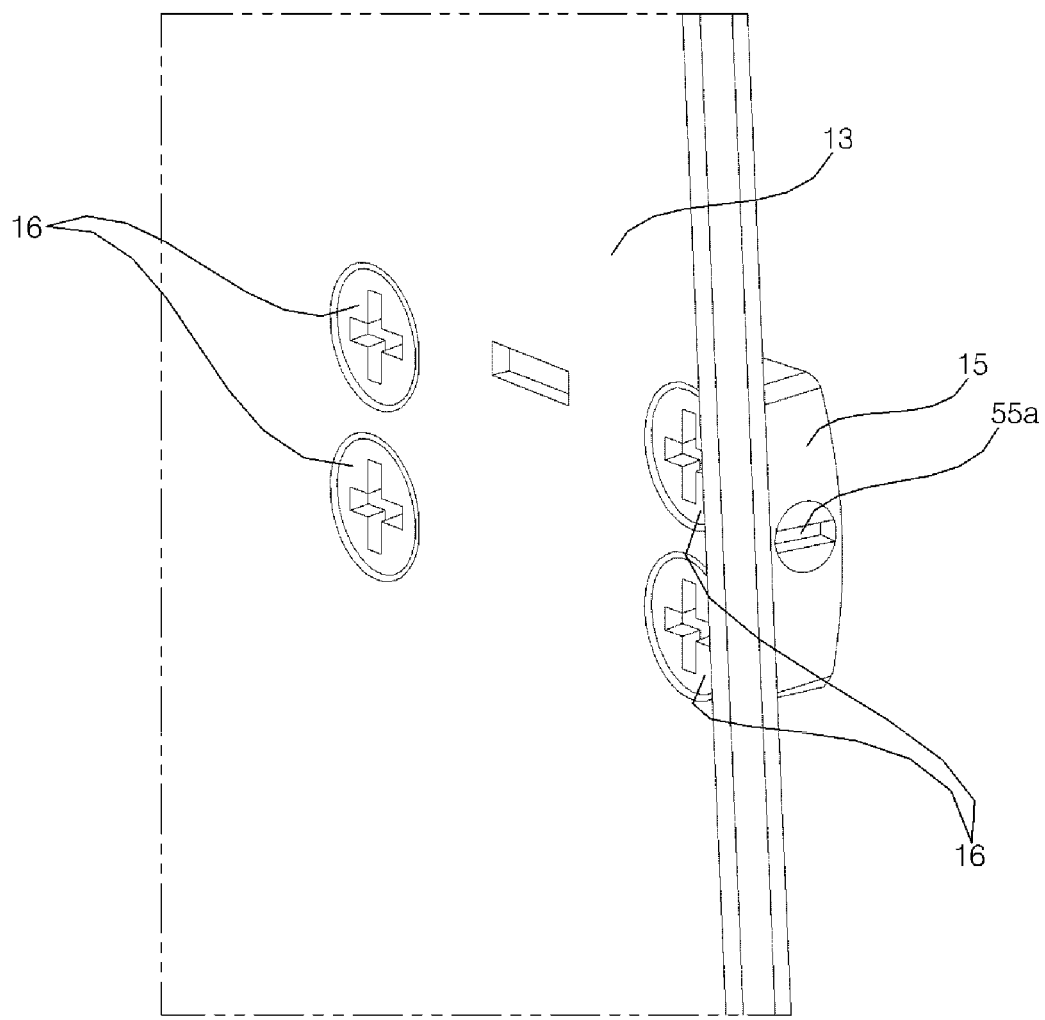

[Fig. 15]
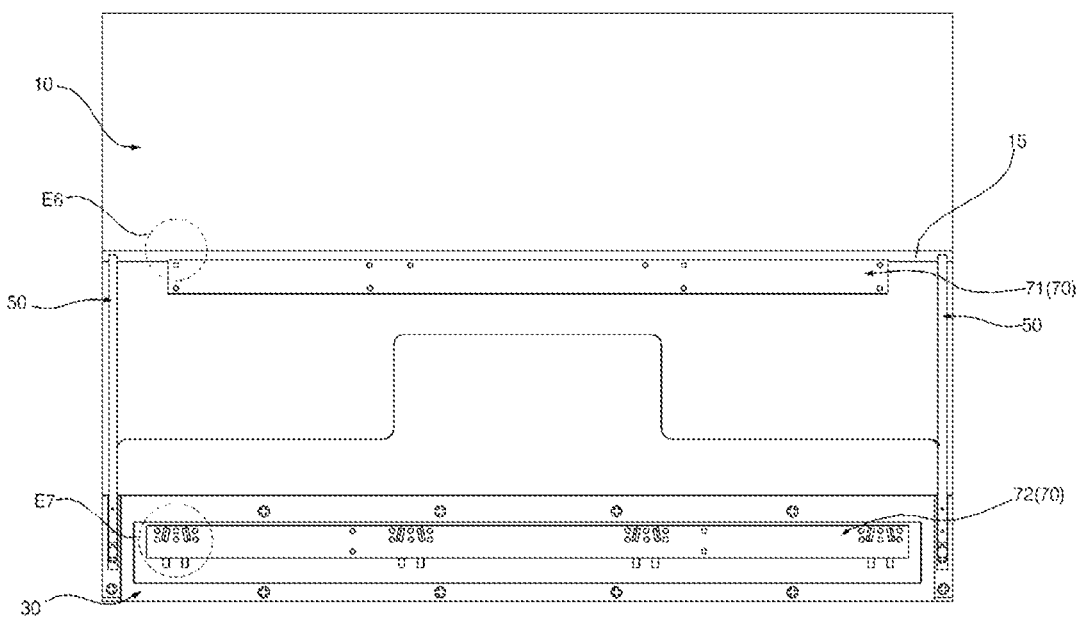

【Fig. 16a】
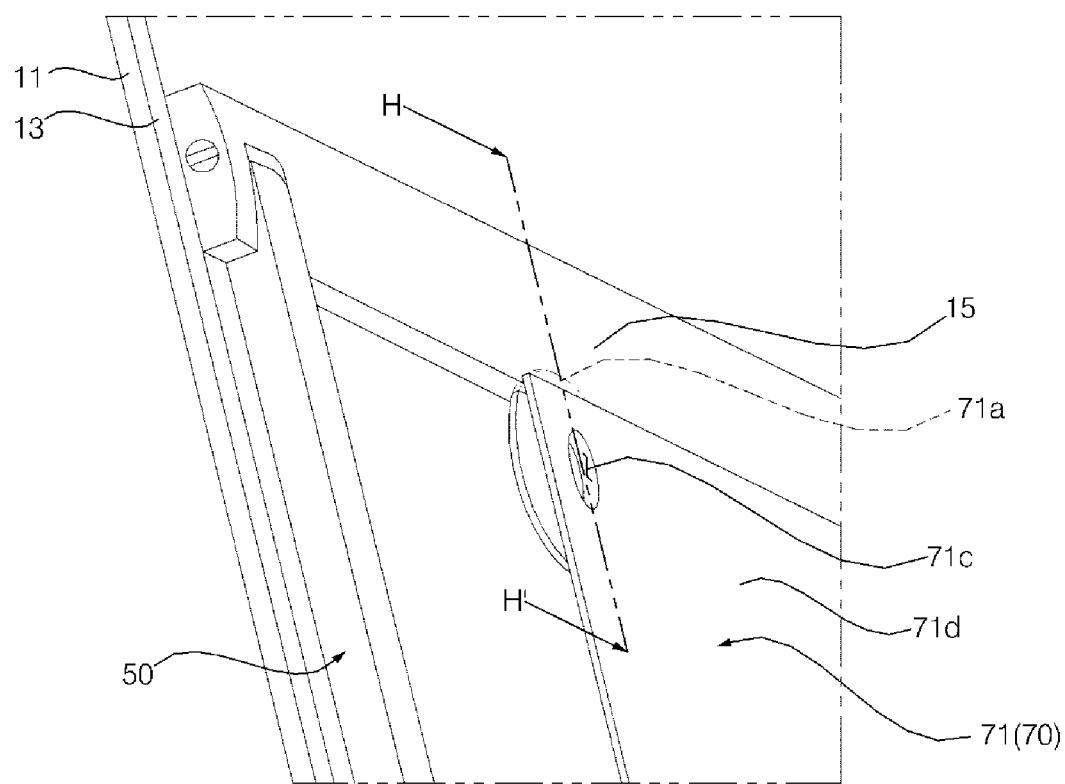

[Fig. 16b]
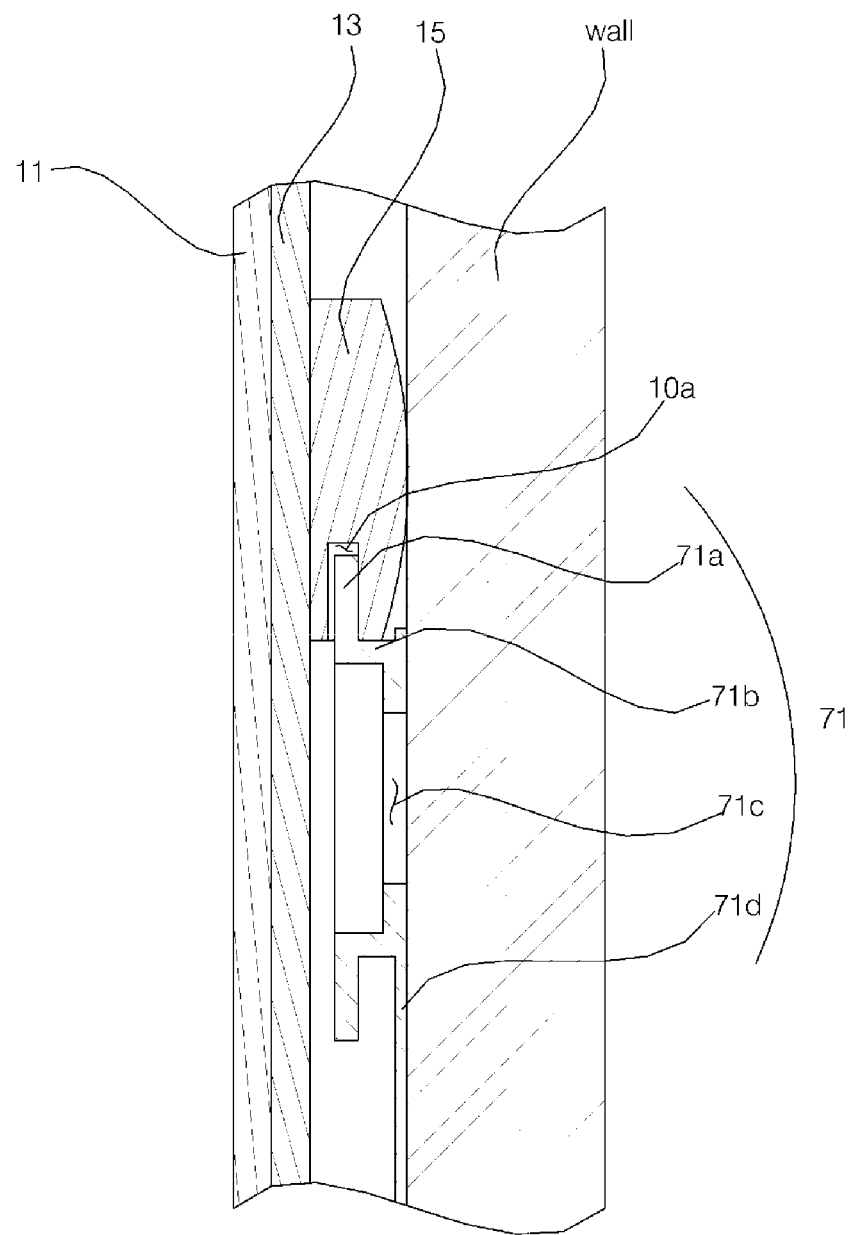

【Fig. 17a】
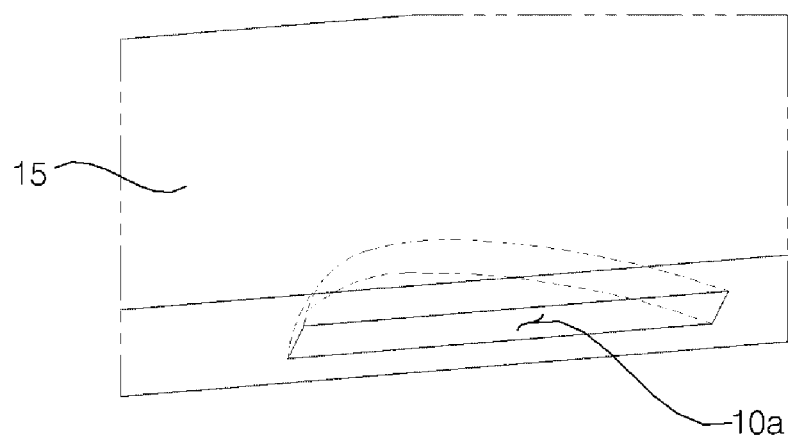
【Fig. 17b】
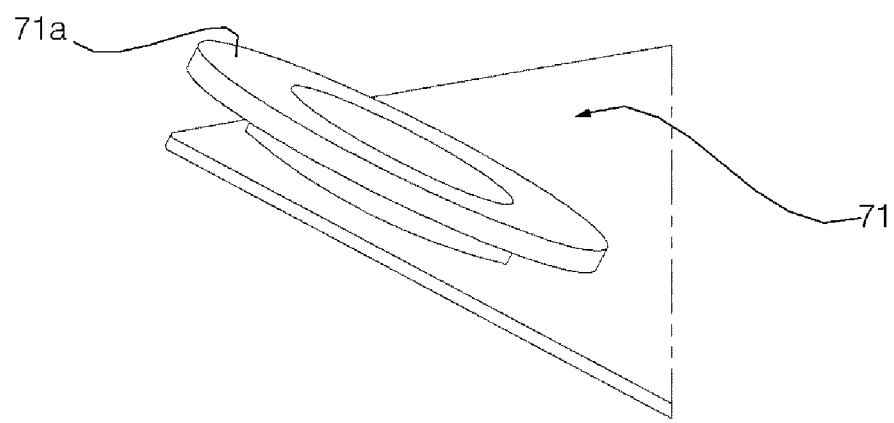

【Fig. 18a】
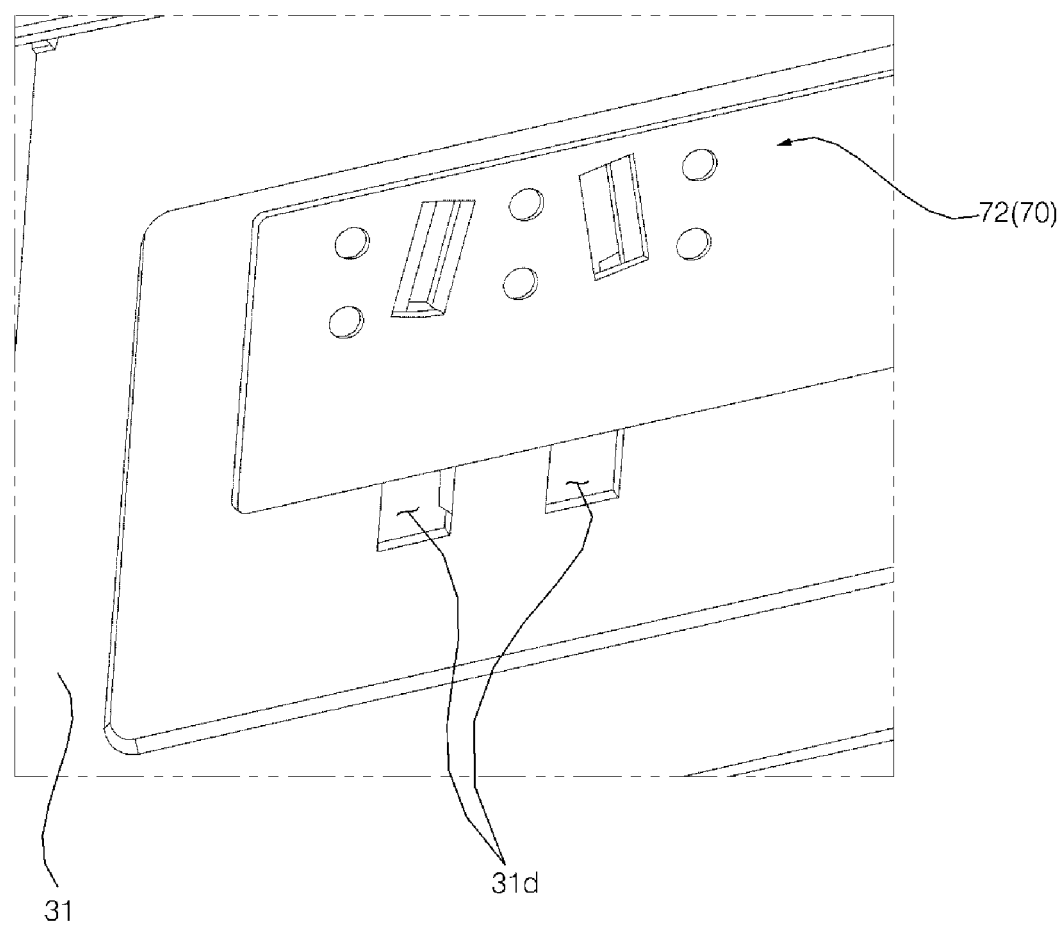

【Fig. 18b】
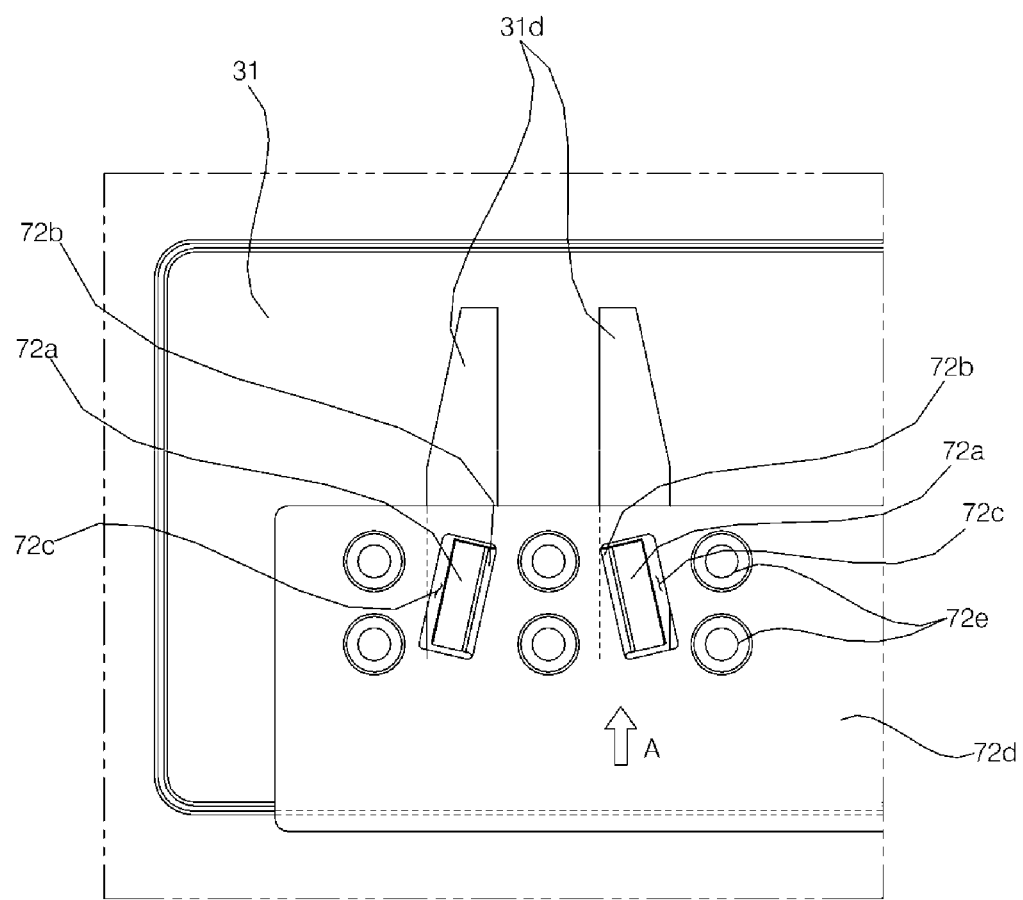

[Fig. 18c]
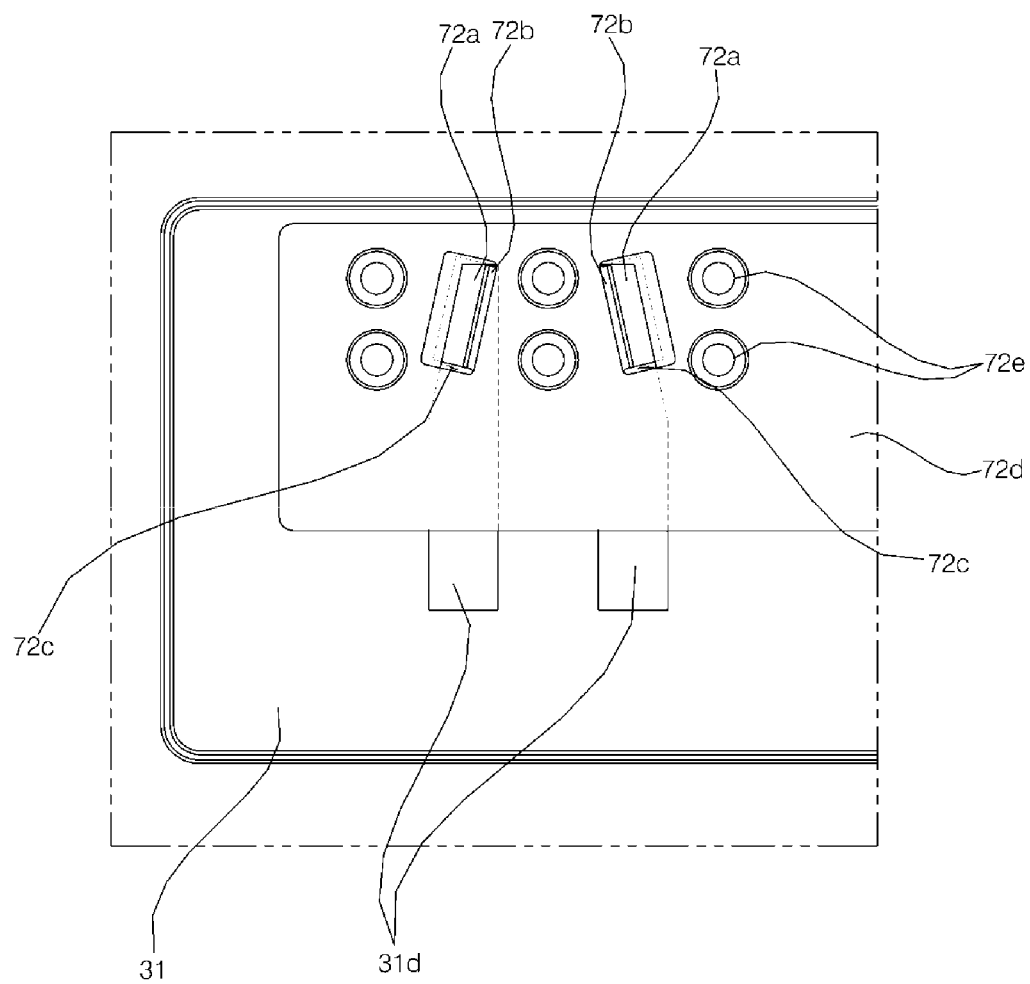

[Fig. 19a]
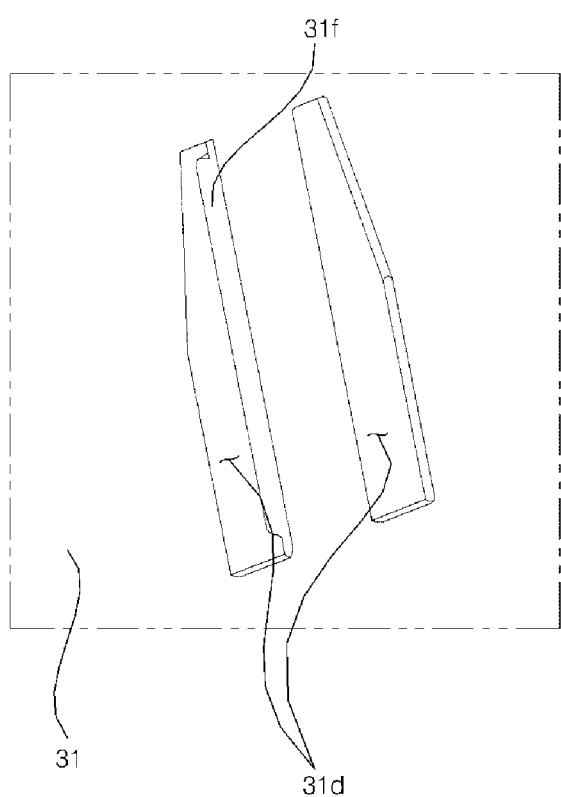

【Fig. 19b】
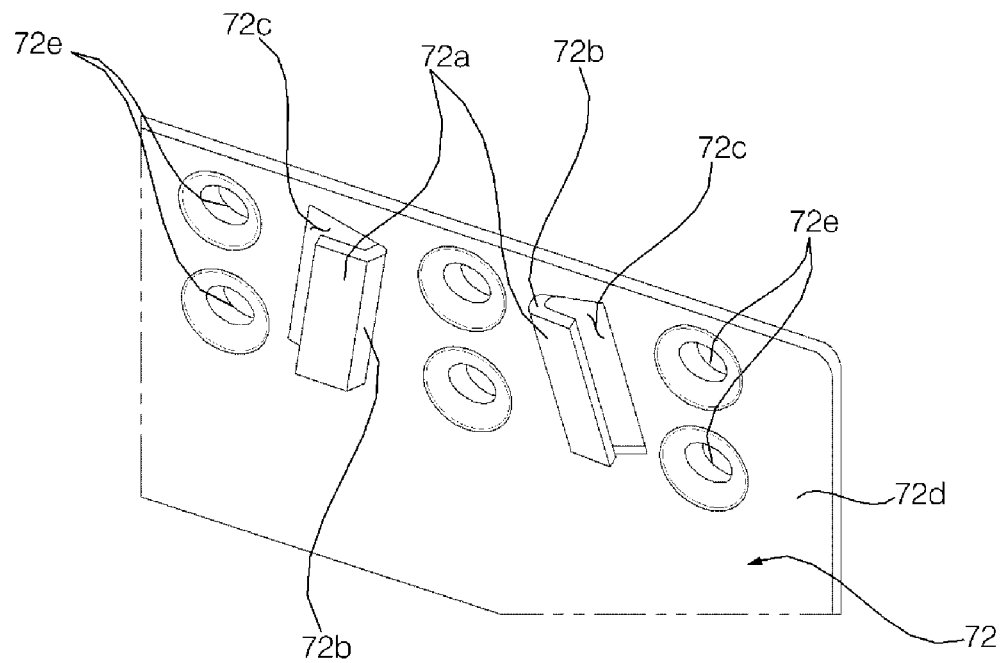

【Fig. 20】
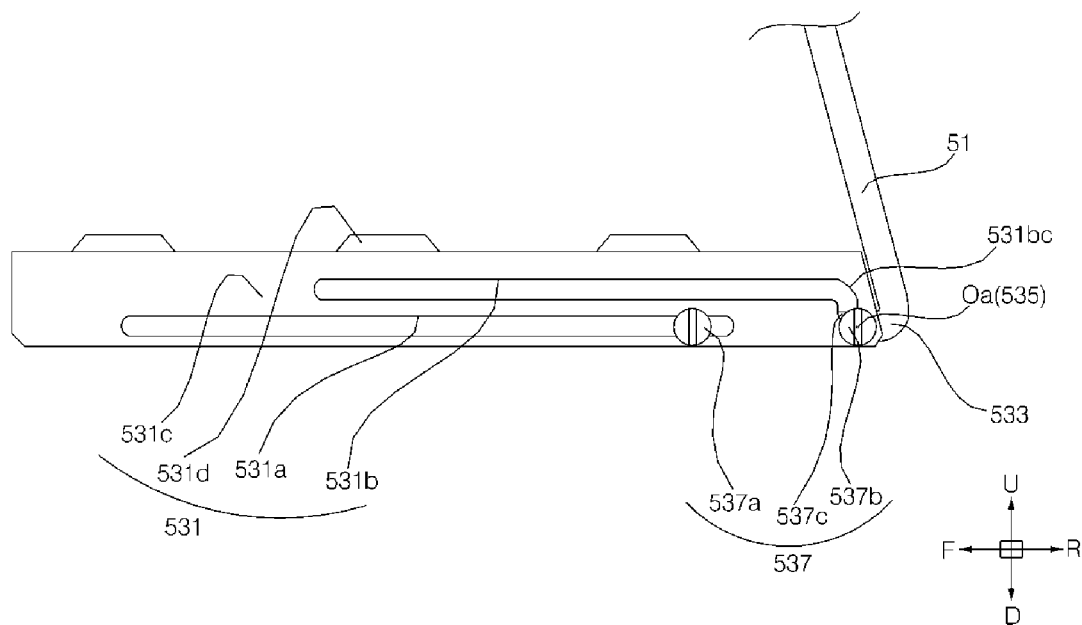
【Fig. 21】
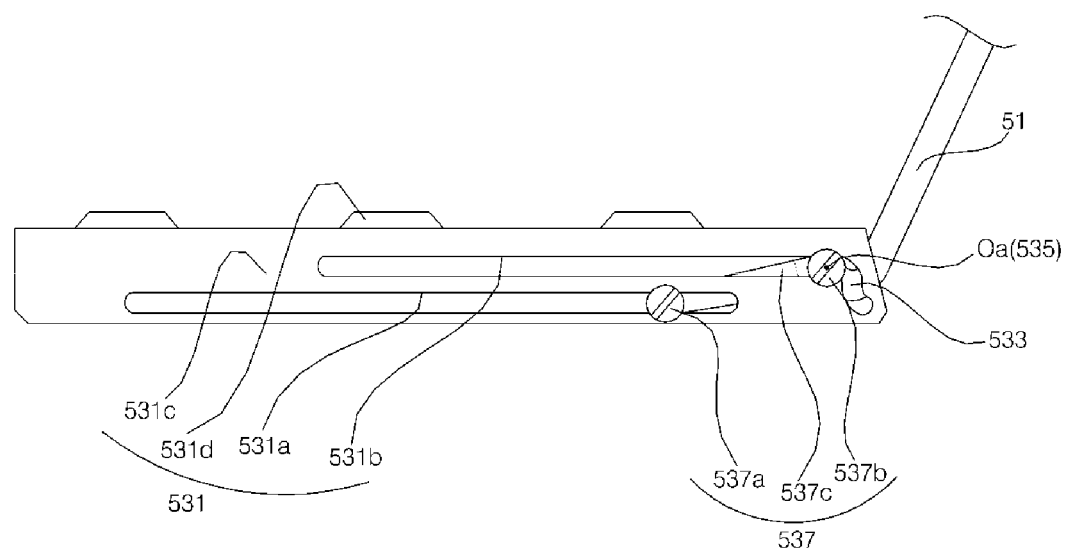

[Fig. 22]
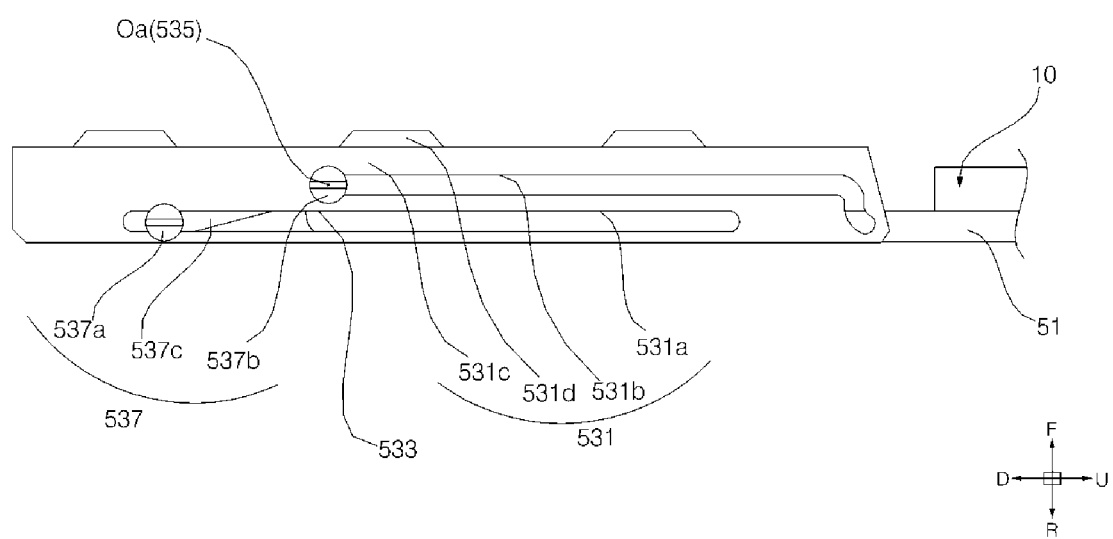

DISPLAY APPARATUS

CROSS-REFERENCE TO RELATED APPLICATION

Pursuant to 35 U.S.C. § 119(a), this application claims the benefit of earlier filing date and right of priority to Korean Patent Application No. 10-2016-0136523, filed Oct. 20, 2016, the contents of which are hereby incorporated by reference herein in its entirety.

BACKGROUND OF THE INVENTION

1. Field of the Invention

The present invention relates to a display apparatus having a structure that is changeable depending on the manner in which a user wishes to dispose the display apparatus.

2. Description of the Related Art

There are various kinds of display panels that realize images. For example, a liquid crystal display panel, a plasma display pane, and an organic light emitting display panel are used.

Examples of conventional display apparatuses include a floor-standing type display apparatus, which stands on a floor, and a wall-mounted type display apparatus, which is fixed to a wall.

FIGS. 1A and 1B show a conventional display apparatus that is changeable between a floor-standing type display apparatus and a wall-mounted type display apparatus. The conventional display apparatus includes a display module 1 for displaying an image forward. When a user uses the display apparatus, he/she may select one from between a floor-standing state shown in FIG. 1A and a wall-mounted state shown in FIG. 1B.

Referring to FIG. 1A, the conventional display apparatus includes a base module 3 disposed on a floor for supporting the lower portion of the display module 1 in the floor-standing state. Referring to FIG. 1B, the base module 3 is rotated about a rotational axis O by 90 degrees in a rotational direction wo in the wall-mounted state. In the wall-mounted state, the rotational axis O is located at the front portion of the base module 3. In the floor-standing state, the front portion of the base module 3 faces upward.

SUMMARY OF THE INVENTION

It is a first object of the present invention to provide a display apparatus configured such that the state of the display apparatus is switchable between a floor-standing state and a wall-mounted state and such that the width of the display apparatus in the forward-rearward direction is minimized in the wall-mounted state.

In the conventional art, a base module having a width in the upward-downward direction under a display module in the floor-standing state is disposed while having the width in the forward-rearward direction in the wall-mounted state. As a result, the rear surface of the display module is spaced apart from a wall by a distance corresponding to the width or more in the wall-mounted state. It is a second object of the present invention to solve the above problem.

It is a third object of the present invention to provide a structure in which the display module is stably supported in the floor-standing state while the width of the display module in the forward-rearward direction is reduced in the wall-mounted state.

It is a fourth object of the present invention to provide a structure in which the display module is in contact with the base module in the wall-mounted state while the width of the display module in the forward-rearward direction is reduced in the wall-mounted state.

It is a fifth object of the present invention to minimize the exposed portion of a structure enabling the state of the display apparatus to be switched between the floor-standing state and the wall-mounted state in the state in which the display apparatus is used.

In accordance with an aspect of the present invention, the above and other objects can be accomplished by the provision of a display apparatus including a display module and a base module configured to be rotatable about a first rotational axis extending in the leftward-rightward direction. The display apparatus is configured to have a first state, in which the base module is configured to be placed on a floor to support the display module, and a second state, in which the base module is rotated by a predetermined angle from the first state. The first rotational axis is disposed at the rear portion of the base module in the second state. The rear portion faces upward or downward in the first state.

The display apparatus may further include a link module for interconnecting the display module and the base module, the link module allowing the base module to move relative to the display module.

The link module may be coupled to the base module so as to be rotatable about the first rotational axis, and may be coupled to the rear portion of the display module so as to be rotatable about a second rotational axis extending in the leftward-rightward direction.

The link module may include a first connection unit connected to the base module so as to be rotatable about the first rotational axis, a second connection unit connected to the rear portion of the display module so as to be rotatable about the second rotational axis extending in the leftward-rightward direction, and a link body disposed to interconnect the first connection unit and the second connection unit. The second connection unit may rotate the link body such that the link body becomes closer to the rear surface of the display module in the second state than in the first state.

The display module may include a display panel, a panel support member coupled to the rear side of the display panel, and a hinge fixing member fixed to the panel support member, the hinge fixing member being connected to the second connection unit. The hinge fixing member may be provided with a display hanging part for fixing the display module in the second state to a wall. The base module may be provided in the rear portion thereof with a base hanging part for fixing the base module in the second state to the wall.

The position of the first rotational axis relative to the base module may be changeable. The link module may be slidable relative to the base module. The position of the first rotational axis relative to the base module may be changed via sliding along the rear portion of the base module. The first connection unit may include a rail extending in the forward-rearward direction in the first state such that the link module is slidable relative to the base module. The first connection unit may include a rail extending in the upward-downward direction in the second state such that the link module is slidable relative to the base module. The first connection unit may include a rail extending in the forward-rearward direction in the first state and extending in the upward-downward direction in the second state such that the link module is slidable relative to the base module.

The first connection unit may include a rail fixed to the base module, the rail extending in the forward-rearward direction in the first state, and a slide configured to be movable along the rail. The first connection unit may include a rotary part disposed between the slide and the link body for enabling the slide and the link body to be rotatable relative to each other about the first rotational axis.

A portion of the display module and a portion of the base module that contact each other in the first state may be separated from each other in the second state.

The display module may include a reception connection terminal for receiving an image signal. The base module may include a base cabinet defining the external appearance thereof, a control unit provided in the base cabinet for controlling the image signal of the display module, and a transmission connection terminal configured to contact the reception connection terminal for transmitting the image signal from the control unit to the display module. The transmission connection terminal may include a first transmission connection terminal configured to contact the reception connection terminal in the first state and a second transmission connection terminal configured to contact the reception connection terminal in the second state.

In an embodiment of the present invention, the rear portion faces downward and the first rotational axis is disposed at a rear-lower side of the base module in the first state.

In another embodiment of the present invention, the rear portion faces upward and the first rotational axis is disposed at the rear-upper side of the base module in the first state.

In an embodiment, the rail may include a first rail part and a second rail part spaced apart from each other in the vertical plane. The slide may include a first slide part configured to slide along the first rail part and a second slide part configured to slide along the second rail part. The slide may include a slide body, to which the first slide part and the second slide part are fixed, the slide body being configured to rotate relative to the rail about the first slide part when the link body rotates relative to the slide.

In an embodiment, the second slide part may move such that the direction in which the link body rotates relative to the rail and the direction in which the slide rotates relative to the rail are opposite to each other. The second slide part may slide while rotating such that the direction in which the link body rotates relative to the rail and the direction in which the slide rotates relative to the rail are opposite to each other. The second rail part may be curved in the vertical plane along the moving track of the second slide part.

In an embodiment, the first connection unit may further include a curved part extending while being curved forward from the link body to the rotary part in the first state.

In accordance with another aspect of the present invention, there is provided a display apparatus including a display module for displaying an image forward, a link module coupled to the display module so as to be rotatable about a second rotational axis extending in the leftward-rightward direction, and a base module coupled to the link module so as to be rotatable about a first rotational axis extending in the leftward-rightward direction. The display apparatus is configured to have a first state, in which the base module is configured to be placed on a floor to support the display module, and a second state, in which the base module is rotated by a predetermined angle from the first state. The first rotational axis is disposed at the rear portion of the base module in the second state. The rear portion faces upward or downward in the first state.

In accordance with a further aspect of the present invention, there is provided a display apparatus including a display module for displaying an image forward, a link module rotatably coupled to the display module, and a base module rotatably coupled to the link module. The base module and the link module are rotatable about a first rotational axis extending in the leftward-rightward direction. The link module and the display module are rotatable about a second rotational axis extending in the leftward-rightward direction.

BRIEF DESCRIPTION OF THE DRAWINGS

The accompanying drawings, which are included to provide a further understanding of the invention and which are incorporated in and constitute a part of this application, illustrate embodiments of the invention and together with the description serve to explain the principle of the invention. In the drawings:

FIGS. 1A and 1B are side conceptual views showing a conventional display apparatus, wherein FIG. 1A is a view showing the display apparatus in a floor-standing state and FIG. 1B is a view showing the display apparatus in a wall-mounted state;

FIGS. 2A to 2C are side conceptual views showing a display apparatus according to an embodiment of the present invention, wherein FIG. 2A is a view showing the first state and FIGS. 2B and 2C are views showing the second state, and wherein FIG. 2A is a view showing the state in which a base module supports the lower portion of a display module, FIG. 2B is a view showing the state in which the lower portion of a link module in the first state is rotated forward and the front portion of the base module in the first state is rotated downward, and FIG. 2C is a view showing the state in which the base module in the second state slides upward relative to the link module;

FIGS. 3A to 3C are side conceptual views showing a display apparatus according to another embodiment of the present invention, wherein FIGS. 3A and 3B are views showing the first state and FIG. 3C is a view showing the second state, and wherein FIG. 3A is a view showing the state in which a base module supports the lower portion of a display module, FIG. 3B is a view showing the state in which the lower portion of a link module in the first state is rotated forward and the base module in the first state slides rearward relative to the link module, and FIG. 3C is a view showing the state in which the rear portion of the base module in the first state is rotated downward;

FIG. 4 is a perspective view showing the first state of the display apparatus according to the an embodiment of the present invention;

FIG. 5 is a side elevation view showing the display apparatus of FIG. 4;

FIG. 6A is an enlarged perspective view showing part E1 of FIG. 4 when viewed from below;

FIG. 6B is an enlarged elevation view showing part E1 of FIG. 4 when viewed from below;

FIG. 7 is an enlarged perspective view showing part E1 of FIG. 4 when viewed from above;

FIG. 8 is an enlarged perspective view of part E2 of FIG. 4, showing the base module, with the display module omitted;

FIG. 9 is an enlarged perspective view of part E3 of FIG. 4;

FIG. 10 is a perspective view showing the second state of the display apparatus of FIG. 4;

FIG. 11 is a side elevation view of the display apparatus of FIG. 10;

FIG. 12 is an enlarged perspective view of part E4 of FIG. 10;

FIG. 13 is an enlarged perspective view of part E5 of FIG. 10;

FIG. 14A is a partial sectional view horizontally taken along line G-G' of FIG. 9;

FIG. 14B is a partial perspective view showing the front surface of the display apparatus, with a display panel of FIG. 9 omitted;

FIG. 15 is a rear elevation view showing the state in which a wall-mounting auxiliary member is coupled to the display apparatus of FIG. 10;

FIG. 16A is an enlarged perspective view of part E6 of FIG. 15, showing the state in which a hinge fixing member and a first wall-mounting auxiliary member are coupled to each other;

FIG. 16B is a partial sectional view vertically taken along line H-H' of FIG. 16A;

FIGS. 17A and 17B are partial perspective views showing the state in which the hinge fixing member and the first wall-mounting auxiliary member are separated from each other, wherein FIG. 17A is a view showing a display hanging part formed at the lower surface of the hinge fixing member, and FIG. 17B is a view showing the first wall-mounting auxiliary member;

FIG. 18A is an enlarged perspective view of part E7 of FIG. 15, showing the state in which a base cabinet and a second wall-mounting auxiliary member are coupled to each other;

FIGS. 18B and 18C are rear elevation views of FIG. 18a, showing the process in which the base cabinet and the second wall-mounting auxiliary member are coupled to each other, wherein FIG. 18B is a view showing the state before the coupling process and FIG. 18C is a view showing the state after the coupling process;

FIGS. 19A and 19B are partial perspective views showing the state in which the base cabinet and the second wall-mounting auxiliary member are separated from each other, wherein FIG. 19A is a view showing a base hanging part formed at the rear surface of the base cabinet and FIG. 19B is a view showing the second wall-mounting auxiliary member; and FIGS. 20 to 22 are side elevation views of a first connection unit with the base module of FIGS. 6a, 6B, and 12 being omitted, showing the process in which the first connection unit is operated, wherein FIG. 20 is a view showing the first connection unit in the first state, FIG. 21 is a view showing the state in which a link body is rotated about a first rotational axis Oa and in which a slide, at which the first rotational axis is located, slides while being rotated in the opposite direction, and FIG. 22 is a view showing the state in which the slide slides along a rail in the state in which the link body is disposed so as to be parallel to the rail, whereby the rail reaches the display module.

DETAILED DESCRIPTION OF THE PREFERRED EMBODIMENTS

Exemplary embodiments of the present invention will be described with reference to the attached drawings.

In order to distinguish between an embodiment and another embodiment of the present invention, reference numerals of components of another embodiment are followed by an apostrophe in FIG. 3. In the specification, a description will be given based on an embodiment. Of course, however, the description is applicable to other embodiments.

In the following description, the terms "forward," "rearward," "leftward," "rightward," "upward," and "downward," which indicate directions, are defined based on forward (F), rearward (R), leftward (Le), rightward (Ri), upward (U), and downward (D) directions as illustrated in FIGS. 4 and 10. In this specification, the direction in which a display module 10 outputs an image is defined as the forward direction, and the direction in which a base module 30 is disposed is defined as the downward direction. However, these definitions are given only for clear understanding of the present invention, and the directions may be defined differently depending on the circumstances.

In the following description, the terms "first," "second," and "third" are used only to avoid confusion between designated components, and do not indicate the sequence or importance of the components or the relationships between the components. For example, a display apparatus 1 may include only a second component, and may lack a first component.

A display panel 11 according to the present invention may be formed in a planar shape, a shape having a two-dimensional curvature, or a shape having a three-dimensional curvature. A panel support member 13 and/or a hinge fixing member 15, a description of which will follow, may be formed in a shape having a curvature such that the display panel 11 has a curvature. In this embodiment, a planar display panel 11 will be described. However, the present invention is not limited thereto.

In the following description, the "first state" means the state in which a base module 30 is configured to be disposed on a floor to support a display module 10. In the first state, the width of the base module 30 in the forward-rearward direction may be larger than that of the base module 30 in the upward-downward direction. The "second state" means the state in which the base module 30 is rotated by a predetermined angle from the first state. In the second state, the width of the base module 30 in the upward-downward direction may be larger than that of the base module 30 in the forward-rearward direction. A user may switch between the first state and the second state to use the display apparatus as a floor-standing type display apparatus or as a wall-mounted type display apparatus.

Referring to FIGS. 2A to 3C, a display apparatus includes a display module 10 for displaying an image and a base module 30 for supporting the display module 10 in the first state. The display apparatus further includes a link module 50 for interconnecting the display module 10 and the base module 30.

Referring to FIGS. 2A, 3A, and 3B, in the first state, the lower portion of the display module 10 is supported by the upper portion of the base module 30 while being in contact with the upper portion of the base module 30, and the rear portion of the display module 10 is supported by the upper portion of the link module 50 while being in contact with the upper portion of the link module 50. In the first state, the lower surface of the base module 30 is supported by a floor while being in contact with the floor. In the first state, the thickness t of the base module 30 in the upward-downward direction is smaller than that of the base module 30 in the forward-rearward direction.

Referring to FIGS. 2B, 2C, and 3C, in the second state, at least one selected from between the rear portion of the display module 10 and the rear portion of the base module 30 is supported by a wall. In one example, the rear portion of the display module 10 may be fixed to a wall, and the link module 50 and the base module 30 may be supported by the display module 10. In another example, the rear portion of the base module 30 may be fixed to a wall, and the link module 50 and the display module 10 may be supported by the base module 30. In a further example, the display module 10 and the base module 30 may be fixed to a wall, and the link module 50 may be supported by the display module 10 and the base module 30. In the second state, the thickness t of the base module 30 in the forward-rearward direction is smaller than that of the base module 30 in the upward-downward direction. The base module 90 may be rotated by 90 degrees such that the upward-downward direction of the base module 30 in the first state becomes the forward-rearward direction of the base module 30 in the second state.

In the second state, a first rotational axis Oa is disposed at the rear portion Sh of the base module 30. In the first state, the rear portion Sh faces upward or downward. In an embodiment (see FIGS. 2A to 2C), the rear portion Sh in the second state is disposed so as to face downward in the first state. In another embodiment (see FIGS. 3A to 3C), the rear portion Sh in the second state is disposed so as to face upward in the first state.

Referring to FIGS. 2A to 3C, the display module 10 outputs an image forward F.

Referring to FIGS. 2A to 3C, the base module 30 is configured to be rotatable about the first rotational axis Oa, which extends in the leftward-rightward direction. The base module 30 is coupled to the link module 50 so as to be rotatable about the first rotational axis Oa.

Referring to FIGS. 2A to 3C, the link module 50 is configured such that the base module is movable relative to the display module 10. The link module 50 is configured as to be rotatable about a second rotational axis Ob, which extends in the leftward-rightward direction. The link module 50 is configured as to be rotatable about the first rotational axis Oa. The link module 50 is coupled to the display module 10 so as to be rotatable about the second rotational axis Ob. The first rotational axis Oa and the second rotational axis Ob are parallel to each other. One end of the link module 50 is coupled to the base module 30, and the other end of the link module 50 is coupled to the display module 10. The link module 50 is coupled to the rear portion of the display module 10.

An embodiment of the present invention will be described with reference to FIGS. 2A to 2C. In the first state, the rear portion of the base module 30 in the second state is disposed so as to face downward. In the first state, the first rotational axis Oa is disposed at the lower portion and the rear portion of the base module 30. That is, in the first state, the first rotational axis Oa is disposed at rear of the lower portion of the base module 30.

The display apparatus shown in FIG. 2A is in the first state. In this embodiment, the first rotational axis Oa is disposed at the lower portion Sh of the base module 30 in the first state. The display apparatus shown in FIGS. 2B and 2C is in the second state after the base module 30 is rotated by a predetermined angle from the first state. The state shown in FIG. 2B or the state shown in FIG. 2C may be an example of the second state. Hereinafter, the state of the display apparatus shown in FIG. 2B will be referred to as a 2b state, and the state of the display apparatus shown in FIG. 2C will be referred to as a 2c state, for the convenience of description. That is, the second state includes the 2b state and the 2c state. In this embodiment, the first rotational axis Oa is disposed at the rear portion Sh of the base module 30 in the second state. Referring to FIG. 1B, on the other hand, the rotational axis O is disposed at the front portion Sh of the base module 3 in the second state.

Referring to FIG. 2A, the base module 30 in the first state supports the display module 10 at the lower side of the display module 10. The upper portion of the base module 30 in the first state contacts the lower portion of the display module 10. The upper portion of the base module 30 separably contacts the lower portion of the display module 10. The link module 50 supports the rear portion of the display module 10 such that the display module 10 is not pushed rearward. The first rotational axis Oa is disposed at the lower portion of the base module 30 in the first state. The first rotational axis Oa is disposed at the rear portion of the base module 30 in the first state. The base module 30 in the first state has a predetermined thickness t in the upward-downward direction. In the first state, the base module 30 has the thickness t under the lower end of the display module 10. The front portion of the base module 30 in the first state is rotatable counterclockwise about the first rotational axis Oa. In FIGS. 2A and 2B, a rotatable track w1a of the base module 30 is shown. The position of the first rotational axis Oa relative to the display module 10 may be changed. The position of the first rotational axis Oa relative to the display module 10 is changed by the rotation of the link module 50 about the second rotational axis Ob. The position of the first rotational axis Oa relative to the base module 30 may be changed. The position of the first rotational axis Oa relative to the base module 30 is changed by the sliding of the base module 30. The lower portion of the link module 50 in the first state is rotatable clockwise about the second rotational axis Ob. In FIGS. 2A to 2C, a rotatable track w1b of the base module 30 is shown.

Referring to FIG. 2B, the base module 30 is separated from the lower surface of the display module 10 in the 2b state. The base module 30 in the second state is located at a position after being rotated counterclockwise by 90 degrees from the first state. The front portion of the base module 30 in the first state is disposed so as to face downward in the second state. The lower portion Sh of the base module 30 in the first state becomes the rear portion Sh of the base module 30 in the second state. In the second state, the first rotational axis Oa is disposed at the rear portion Sh of the base module 30. The rear portion Sh in the second state is disposed so as to face downward in the first state. In the second state, the base module 30 has the predetermined thickness t in the forward-rearward direction. In the second state, the base module 30 has the thickness t at the front portion of the first rotational axis Oa. The link module 50 in the second state is located at a position after being rotated clockwise by a predetermined angle from the first state. The link module 50 in the second state extends in the upward-downward direction. The link module 50 in the second state is parallel to the display module 10. The link module 50 in the second state is disposed so as to contact the rear surface of the display module 10. In the 2b state, the lower end of the display module 10 is spaced apart from the upper end of the base module 30 by a predetermined distance. In the 2b state, the predetermined distance between the lower end of the display module 10 and the upper end of the base module 30 corresponds to the distance s1 by which the base module 30 is slidable relative to the link module 50 in the upward-downward direction. In the 2b state, the base module 30 is slidable upward relative to the link module 50. In the 2b state, the sum of the distance s1 by which the base module 30 is slidable relative to the link module 50 and the distance by which the lower end of the display module 10 is spaced apart from the second rotational axis Ob corresponds to the distance between the first rotational axis Oa and the second rotational axis Ob.

The 2c state will be described based on the difference from the 2b state with reference to FIG. 2C. The base module 30 in the 2c state is located at a position after sliding upward relative to the link module 50. The base module 30 in the 2c state is located at a position after sliding upward a predetermined distance s1 from the 2b state. In the 2c state, the lower portion of the display module 10 contacts the upper portion of the base module 30. The upper portion of the base module 30 in the 2c state is the rear portion of the base module 30 in the first state.

Another embodiment of the present invention will be described with reference to FIGS. 3A to 3C. In the first state, the rear portion of the base module 30 in the second state is disposed so as to face upward. In the first state, the first rotational axis Oa is disposed at the upper portion and the rear portion of the base module 30. That is, in the first state, the first rotational axis Oa is disposed at the rear of the upper portion of the base module 30.

The display apparatus shown in FIGS. 3A and 3B is in the first state. The state shown in FIG. 3A or the state shown in FIG. 3B may be an example of the first state. Hereinafter, the state of the display apparatus shown in FIG. 3A will be referred to as a 1a state, and the state of the display apparatus shown in FIG. 3B will be referred to as a 1b state, for the convenience of description. That is, the first state includes the 1a state and the 1b state. In this embodiment, the first rotational axis Oa is disposed at the upper portion Sh of the base module 30' in the first state. The display apparatus shown in FIG. 3C is in the second state after the base module 30' is rotated by a predetermined angle from the first state. In this embodiment, the first rotational axis Oa is disposed at the rear portion Sh of the base module 30' in the second state. Referring to FIG. 1B, on the other hand, the rotational axis O is disposed at the front portion Sh of the base module 3 in the second state.

Referring to FIG. 3A, the base module 30' in the first state supports the display module 10' at the lower side of the display module 10'. The upper portion of the base module 30' in the 1a state contacts the lower portion of the display module 10'. The upper portion of the base module 30' in the 1a state separably contacts the lower portion of the display module 10'. The link module 50' in the 1a state supports the rear portion of the display module 10' such that the display module 10' is not pushed rearward. The first rotational axis Oa is disposed at the upper portion of the base module 30' in the first state. The first rotational axis Oa is disposed at the rear portion of the base module 30' in the 1a state. The base module 30' in the first state has a predetermined thickness t in the upward-downward direction. In the first state, the base module 30' has the thickness t under the lower end of the display module 10'. The front portion of the base module 30' in the first state is rotatable counterclockwise about the first rotational axis Oa. In FIGS. 3A to 3C, a rotatable track w2a of the base module 30' is shown. The position of the first rotational axis Oa relative to the display module 10' may be changed. The position of the first rotational axis Oa relative to the display module 10' is changed by the rotation of the link module 50' about the second rotational axis Ob. The position of the first rotational axis Oa relative to the base module 30' may be changed. The position of the first rotational axis Oa relative to the base module 30' is changed by the sliding of the base module 30'. The lower portion of the link module 50' in the 1a state is rotatable clockwise about the second rotational axis Ob. In FIGS. 3A to 3C, a rotatable track w2b of the base module 30' is shown. In the 1a state, the base module 30' is slidable rearward relative to the link module 50'. In the 1a state, the sum of a value obtained by subtracting the distance s2 by which the base module 30' is slidable relative to the link module 50' from the distance of the base module 30' in the forward-rearward direction and the distance by which the lower end of the display module 10' is spaced apart from the second rotational axis Ob corresponds to the distance between the first rotational axis Oa and the second rotational axis Ob.

The 1b state will be described based on the difference from the 1a state with reference to FIG. 3B. In the 1b state, the base module 30' is separated from the lower surface of the display module 10'. The link module 50' in the 1b state is located at a position after being rotated clockwise by a predetermined angle from the 1a state. The link module 50' in the 1b state extends in the upward-downward direction. The link module 50' in the 1b state is parallel to the display module 10'. The link module 50' in the 1b state is disposed so as to contact the rear surface of the display module 10'. In the 1b state, the lower end of the display module 10' is spaced apart from the upper end of the base module 30' by a predetermined distance. The predetermined distance between the lower end of the display module 10' and the upper end of the base module 30' in the 1b state corresponds to the distance by which the front end of the base module 30' in the 1b state protrudes from the first rotational axis Oa. The base module 30' in the 1b state is located at a position after sliding forward relative to the link module 50'. The base module 30' in the 1b state is located at a position after sliding forward a predetermined distance s2 from the 1a state.

Referring to FIG. 3C, the base module 30' in the second state is located at a position after being rotated clockwise by 90 degrees from the first state. The rear portion of the base module 30' in the first state is disposed so as to face downward in the second state. The upper portion Sh of the base module 30' in the first state becomes the rear portion Sh of the base module 30' in the second state. In the second state, the first rotational axis Oa is disposed at the rear portion Sh of the base module 30'. The rear portion Sh in the second state is disposed so as to face upward in the first state. In the second state, the base module 30' has the predetermined thickness t in the forward-rearward direction. In the second state, the base module 30' has the thickness t at the front portion of the first rotational axis Oa. In the second state, the lower portion of the display module 10' contacts the upper portion of the base module 30'. The upper portion of the base module 30' in the second state is the front portion of the base module 30' in the first state.

Hereinafter, an embodiment will be described with reference to FIGS. 4 to 22. However, the following description is applicable to another embodiment within an obvious range. FIGS. 4 to 9 show the display apparatus in the first state, and FIGS. 10 to 13 show the display apparatus in the second state. FIGS. 14A and 14B show coupling between components of the display module. FIGS. 15 to 19B show a structure for fixing the display apparatus in the second state to a wall. FIGS. 20 to 22 show the process in which a first connection unit of the link module 50 is operated.

The display module 10 includes a display panel 11, having a light emitting device (not shown), for displaying an image forward. The display panel 11 may be made of a flexible material. For example, the display panel 11 may be an OLED display panel.

The display panel 11 may be formed in the shape of a plate having a predetermined thickness. When viewed from the front, the display panel 11 may have a quadrangular shape.

The display panel 11 may include two ends parallel to the first rotational axis Oa and two ends perpendicular to the first rotational axis Oa.

The display panel 11 may have a layered structure. The display panel 11 includes the light emitting device, a base layer (not shown) on which the light emitting device is disposed, the base layer being disposed at the rear surface of the light emitting device, and a cover layer (not shown) for covering the front surface of the light emitting device. The base layer and/or the cover layer may include a plurality of layers. The light emitting device may be disposed between the base layer and the cover layer in a sealed state. For example, the light emitting device may be an OLED, the base layer may be made of a thin glass material or a thin metal material such as a thin alloy, and the cover layer may be made of a thin transparent material. In this embodiment, the base layer has a thickness of 0.1T (i.e. 0.1 mm) and is made of invar, and the cover layer has a thickness of 0.7T (i.e. 0.7 mm) and is made of glass. In this embodiment, the light emitting device is an OLED, and the display panel 11 is flexible. Invar is an alloy of nickel and iron.

The display module 10 includes a panel support member 13 coupled to the rear side of the display panel. The panel support member 13 is disposed at the rear surface of the display panel 11. The panel support member 13 supports the display panel 11.

The panel support member 13 may include a rear cover 13 coupled to the rear surface of the display panel 11. The rear cover 13 may be formed in the shape of a plate having a predetermined thickness. In this embodiment, the rear cover 13 has a thickness of 1.2T (i.e. 1.2 mm) and is made of aluminum. When the rear surface of the display panel 11 is seen vertically, the rear cover 13 may be disposed so as to entirely cover the rear surface of the display panel 11.

When viewed from the rear, the panel support member 13 may have a quadrangular shape. The rear cover 13 may include two ends parallel to the first rotational axis Oa and two ends perpendicular to the first rotational axis Oa.

Referring to FIG. 14A, the display module 10 includes an attachment member 12 for attaching the rear surface of the display panel 11 to the front surface of the panel support member 13. The attachment member 12 couples the rear surface of the display panel 11 to the rear cover 13. The attachment member 12 may include an adhesive material. The attachment member 12 may be a piece of double-sided tape or an adhesive. The attachment member 12 may include a magnet material. The attachment member 12 is disposed between the display panel 11 and the rear cover 13. The attachment member 12 may be formed to have a thin layer.

The display module 10 includes a hinge fixing member 15 for fixing the link module 50. The hinge fixing member 15 is fixed to the panel support member 13. The hinge fixing member 15 is coupled and fixed to the rear surface of the panel support member 13. The hinge fixing member 15 is coupled to a second connection unit 55 of the link module, a description of which will follow. Of course, the second connection unit 55 may be directly coupled to the rear cover 13.

The hinge fixing member 15 may be formed in a bar shape. The hinge fixing member 15 may extend in a direction parallel to the second rotational axis Ob. The hinge fixing member 15 may extend in the leftward-rightward direction. The hinge fixing member 15 may be disposed across the middle of the rear surface of the panel support member 13. Opposite ends of the hinge fixing member 15 may be disposed at opposite ends of the display module 10. A pair of link modules 50 may be disposed at the opposite ends of the display module 10. The link modules 50 may be coupled to the opposite ends of the hinge fixing member 15.

Referring to FIGS. 14A and 14B, the display module 10 includes a fastening member 16 for fastening the panel support member 13 and the hinge fixing member 15 to each other. The fastening member 16 may be a screw. In the case in which the fastening member 16 is a screw, the screw may extend through the panel support member 13 from the front to the rear of the panel support member 13, and the rear end of the screw may be fastened in the hinge fixing member 15. The screw head of the fastening member 16 may be disposed between the display panel 11 and the panel support member 13.

Referring to FIG. 14B, the display module may include a plurality of fastening members 16. The fastening members 16 may be arranged along the upper portion of the hinge fixing member 15 so as to be spaced apart from each other in the leftward-rightward direction. The fastening members 16 may be arranged along the lower portion of the hinge fixing member 15 so as to be spaced apart from each other in the leftward-rightward direction. The fastening members 16 may be arranged in the state of being spaced apart from each other in the upward-downward direction and extending in the leftward-rightward direction. That is, the fastening members 16 may be arranged in two lines. A hinge shaft 55a may be disposed between one line of fastening members 16 and another line of fastening members 16, which are spaced apart from each other in the upward-downward direction. The fastening members 16 fasten the panel support member 13 to the hinge fixing member 15 without interference with the hinge shaft 55a.

Referring to FIG. 14B, the fastening members 16 may be disposed so as to be spaced apart from each other in the leftward-rightward direction around the portion of the link module 50 connected to the hinge fixing member 15. The fastening members 16 may be arranged in the state of being spaced apart from each other in the leftward-rightward direction and extending in the upward-downward direction. That is, the fastening members 16 may be arranged in two lines. The fastening members 16 fasten the panel support member 13 to the hinge fixing member 15 without interference with the link module 50. The display module 10 may further in clued a reinforcement member (not shown) for increasing the rigidity of the panel support member 13. The reinforcement member may increase the bending rigidity of the panel support member 13. The reinforcement member may be disposed at the edge of the panel support member 13. The reinforcement member may be coupled to the display panel 11 and/or the rear cover 13. The reinforcement member may include a first reinforcement member (not shown) disposed perpendicular to the first rotational axis Oa. The first reinforcement member may extend in a direction perpendicular to the first rotational axis Oa. The reinforcement member may include a second reinforcement member (not shown) disposed parallel to the first rotational axis Oa. The second reinforcement member may extend in a direction parallel to the first rotational axis Oa. The reinforcement member may be formed to have a curvature in the forward-rearward direction such that the display panel 11 has a curvature.

The display module 10 includes a wiring unit 17 for transmitting an image signal from a control unit, a description of which will follow, to the display panel 11. The wiring unit 17 may transmit the image signal to the respective light emitting devices of the display panel 11. The wiring unit 17 may include a cabinet that defines an external appearance at the rear thereof in order to protect a circuit. The cabinet of the wiring unit 17 may be formed integrally with the panel support member 13. Alternatively, the cabinet of the wiring unit 17 may be formed separately from the panel support member 13. In this case, the cabinet of the wiring unit 17 may be coupled to the panel support member 13. The wiring unit 17 may be disposed at the lower side of the rear portion of the display module 10. The wiring unit 17 may protrude further rearward at the lower side of the hinge fixing member 15 than the rear surface of the other part of the panel support member 13. The wiring unit 17 may be disposed between the link modules 50 so as to protrude further rearward than the rear surface of the other part of the panel support member 13. The end of the rearwardly protruding portion of the wiring unit 17 may be disposed further forward than the rear surface of the hinge fixing member 15. The distance by which the wiring unit 17 protrudes rearward from the rear surface of the rear cover 13 may be smaller than a larger one selected from between the thickness of the hinge fixing member 15 in the forward-rearward direction and the thickness of a link body 51 in the forward-rearward direction in the second state.

The display module 10 includes a reception connection terminal 18 for receiving an image signal. The reception connection terminal 18 is disposed on the outer surface of the display module 10. The reception connection terminal 18 receives an image signal from a control unit, a description of which will follow. In the case in which the control unit is provided at the base module 30, the reception connection terminal 18 contacts a transmission connection terminal 38 formed at the base module 30, a description of which will follow, to receive an image signal. The reception connection terminal 18 may be disposed at the lower side of the display module 19.

The portion of the base module 30 in the first state that contacts the display module 10 is different from the portion of the base module 30 in the second state that contacts the display module 10. A portion of the display module 10 and a portion of the base module 30 that contact each other in the first state are separated from each other in the second state. A portion of the display module 10 and a portion of the base module 30 that contact each other in the second state may be separated from each other in the first state. Consequently, a plurality of transmission connection terminals 381 and 382 may contact the reception connection terminal 18 in the first state and in the second state.

The base module 30 includes a base cabinet 31 that defines the external appearance thereof. In the first state, the base cabinet 31 includes an upper surface, a lower surface Sh, a left side surface, a right side surface, a front surface, and a rear surface. In this embodiment, the upper surface and the lower surface Sh of the base cabinet 31 in the first state respectively become the front surface and the rear surface Sh of the base cabinet 31 in the second state. In an embodiment, the front surface and the rear surface of the base cabinet 31 in the first state respectively become the lower surface and the upper surface of the base cabinet 31 in the second state. In another embodiment, the upper surface and the lower surface of the base cabinet 31 in the first state respectively become the front surface and the rear surface Sh of the base cabinet 31 in the second state. In another embodiment, the front surface and the rear surface of the base cabinet 31 in the first state respectively become the upper surface and the lower surface of the base cabinet 31 in the second state.

Referring to FIGS. 6A, 6B, and 12, the base cabinet 31 has a disposition part 31a, in which a first connection unit 53, a description of which will follow, is disposed. The disposition part 31a may be formed by recessing the surface of the base cabinet 31. A rail 531, a description of which will follow, may be disposed in the disposition part 31a. In an embodiment, the disposition part 31a is formed in the lower surface Sh of the base cabinet 31 in the first state. In another embodiment, the disposition part 31a may be formed in the upper surface of the base cabinet 31. The disposition part 31a is a groove extending in the forward-rearward direction, rather than in the leftward-rightward direction, in the first state. The disposition part 31a is a groove extending in the upward-downward direction, rather than in the leftward-rightward direction, in the second state. A pair of disposition parts 31a is formed at opposite ends of the base cabinet 31.

Referring to FIG. 7, the base cabinet 31 has a link body location part 31b, in which a link body 51, a description of which will follow, is located in the first state. The link body location part 31b may be formed by recessing the surface of the base cabinet 31. When rotated, the link body 51 is located in the link body location part 31b in the first state and is separated from the link body location part 31b in the second state. The link body location part 31b is formed in the rear surface of the base cabinet 31 in the first state. The rear surface of the base cabinet 31 in the first state may have an inclined surface corresponding to the inclination of the link body 51. The link body location part 31b may be formed in the inclined surface of the base cabinet 31. The link body location part 31b is a groove extending in the inclination direction of the link body 51 in the first state. A pair of link body location parts 31b is formed at opposite ends of the base cabinet 31.

Referring to FIG. 8, the base cabinet 31 has a display module location part 31c, in which the lower end of the display module 10 is located in the first state. The display module location part 31c may be formed by recessing the surface of the base cabinet 31. The display module 10 is located in the display module location part 31c in the first state, and is separated from the display module location part 31c in the second state. The display module location part 31c is formed in the upper surface of the base cabinet 31 in the first state. The display module location part 31c is a groove formed along the lower end of the display module 10 in the first state. The display module location part 31c extends in the leftward-rightward direction.

The base module 30 includes a control unit (not shown), which is provided in the base cabinet 31. The control unit controls the image signal of the display module 10. The display apparatus may include a speaker (not shown), and the control unit may control an acoustic signal. The control unit may control the application of power to the display panel 11. The control unit may include an input unit (not shown) for allowing a user to manipulate the display apparatus. The control unit may include a communication unit (not shown) for receiving an infrared signal from a remote controller.

The base module 30 may include a reception connection terminal 18 and a transmission connection terminal 38 for transmitting the image signal from the control unit to the display module 10. The transmission connection terminal 38 may contact the reception connection terminal 18 for communicative connection. The control unit may be disposed at the display module 10. In this case, the transmission connection terminal 38 and the reception connection terminal 18 are not needed.

The transmission connection terminal 38 may include a first transmission connection terminal 381 configured to contact the reception connection terminal 18 in the first state and a second transmission connection terminal 382 configured to contact the reception connection terminal 18 in the second state. The connection between the reception connection terminal 18 and the first transmission connection terminal 381 is released in the second state. The connection between the reception connection terminal 18 and the second transmission connection terminal 382 is released in the first state. A plurality of reception connection terminals 18 may be provided. In this case, a plurality of first transmission connection terminals 381 and a plurality of second transmission connection terminal 382 may be provided so as to correspond in number to the reception connection terminals 18.

The link module 50 includes a link body 51 extending between the display module 10 and the base module 30. The link module 50 includes a first connection unit 53 connected to the base module 30 so as to be rotatable about the first rotational axis Oa. The link module 50 includes a second connection unit 55 connected to the rear portion of the display module 10 so as to be rotatable about the second rotational axis Ob. The link body 51 is disposed to interconnect the first connection unit 53 and the second connection unit 55. A pair of link modules 50 may be disposed at the left and right sides.

Referring to FIGS. 4, 5, 10, and 11, the link body 51 may be formed in a bar shape. The link body 51 extends downward from the rear side of the display module 10. The link body 51 extends obliquely downward and rearward in the first state. The link body 51 extends vertically downward in the second state. The link body 51 is rotatable about the first rotational axis Oa. The link body 51 is rotatable about the second rotational axis Ob. In the first state, the link body 51 supports the display module 10 such that the display module 10 is not pushed rearward.

Referring to FIGS. 9 and 13, the second connection unit 55 enables the link body 51 to rotate about the second rotational axis Ob. The second connection unit 55 rotates the link body 51 such that the link body 51 in the second state becomes closer to the rear surface of the display module 10 than the link body 51 in the first state. As a result, the width of the display apparatus in the forward-rearward direction may be minimized in the second state. The second connection unit 55 enables the link body 51 in the first state to rotate relative to the display module 10 in the clockwise direction. The second connection unit 55 enables the link body 51 in the second state to rotate relative to the display module 10 in the counterclockwise direction.

The second connection unit 55 is disposed at the display module 10. The second connection unit 55 is disposed at the rear surface of the display module 10. The second connection unit 55 fixes the position of the second rotational axis Ob relative to the display module 10. The second rotational axis Ob is maintained at a uniform position with respect to the display module 10 irrespective of the rotation of the link body 51. FIGS. 9 and 13 show the position of the second rotational axis Ob.

The second connection unit 55 includes a hinge structure having the second rotational axis Ob. The second connection unit 55 includes a hinge shaft 55a configured to be rotatable about the second rotational axis Ob. The hinge shaft 55a extends through the hinge fixing member 15 and the link module 50. The hinge fixing member 15 and the link module 50 are provided with hinge holes 55b, through which the hinge shaft 55a extends. The link body 51 is disposed so as to be rotatable about the hinge shaft 55a.

Referring to FIGS. 6A, 6B, 12, and 19 to 21, the first connection unit 53 enables the link body 51 to rotate about the first rotational axis Oa. The second connection unit 55 enables the base module 30 in the first state to rotate relative to the link module 50 in the counterclockwise direction. The first connection unit 53 enables the base module 30 in the second state to rotate relative to the link module 50 in the clockwise direction.

The first connection unit 53 is disposed at the base module 30. The first connection unit 53 is disposed at the lower portion of the base module 30 in the first state. The first connection unit 53 is configured such that the position of the first rotational axis Oa relative to the base module 30 is changeable. The position of the first rotational axis Oa relative to the base module 30 is changed in response to the rotation of the link body 51. FIGS. 20 to 22 show the position of the first rotational axis Oa.

The first connection unit 53 includes a rotary part 535 having the first rotational axis Oa. The rotary part 535 is disposed between a slide 537, a description of which will follow, and the link body 51. The rotary part 535 is configured such that the slide 537 and the link body 51 are rotatable relative to each other about the first rotational axis Oa.

The rotary part 535 includes a shaft (not shown) disposed on the first rotational axis Oa. The shaft extends through the slide 537 and a curved part 533, a description of which will follow. The slide 537 and the curved part 533 are provided with holes (not shown), through which the shaft extends. The link body 51 is disposed so as to be rotatable about the shaft. The shaft moves together with the slide 537. The shaft slides in response to sliding of the slide 537. The shaft may be disposed on the central axis of a second slide part 537b, a description of which will follow, in the leftward-rightward direction. The shaft may be integrally formed with the second slide part 537b so as to slide together with the second slide part 537b.

The link module 50 is configured to be movable relative to the base module 30. The link module 50 is configured to be slidable relative to the base module 30. When the state of the display apparatus is changed from the first state to the second state, the link module 50 slides relative to the base module 30. When the state of the display apparatus is changed from the second state to the first state, the link module 50 slides relative to the base module 30.

The first connection unit 53 is configured such that the link body 51 is slidable relative to the base module 30. The first connection unit 53 is configured such that the position of the first rotational axis Oa relative to the base module 30 is changeable via sliding along the rear portion Sh of the base module 30 in the first state. In the second state, the position of the first rotational axis Oa relative to the base module 30 is changeable via sliding along the rear portion Sh. In this embodiment, the link body 51 is caught by the base cabinet 31 such that in the first state, the position of the first rotational axis Oa relative to the base module 30 is not changeable via sliding along the rear portion Sh. In the second state, the position of the first rotational axis Oa relative to the base module 30 is changed via sliding in the upward-downward direction.

The first connection unit 53 includes a rail 531 for enabling the link body 51 to slide relative to the base module 30 and a slide 537 configured to slide along the rail 531. One selected from between the rail 531 and the slide 537 is coupled to the base module 30, and the other is coupled to the link body 51. In this embodiment, the rail 531 is fixed to the base module 30. In this embodiment, the slide 537 is rotatably coupled to the link body 51.

In the first state, the rail 531 extends in the forward-rearward direction. In the second state, the rail 531 extends in the upward-downward direction. In the second state, the slide 537 slides along the rail 531 in the upward-downward direction. In the first state, the slide 537 may slide along the rail 531 in the forward-rearward direction. In this embodiment, however, the link body 51 is caught by the base cabinet 31 such that, in the first state, the slide 537 cannot slide in the forward-rearward direction.

The rail 531 includes a first rail part 531a and a second rail part 531b spaced apart from each other in the vertical plane. The rail 531 includes a rail body 531c, on which the first rail part 531a and the second rail part 531b are disposed and which is fixed to the base module 30. The rail 531 includes a rail fixing part 531d for fixing the rail body 531c to the base module 30.

The rail body 531c is disposed at the disposition part 31a. The rail body 531c is fixed to one side surface of the base cabinet 31. The rail body 531c is fixed to the lower surface of the base cabinet 31 in the first state. The rail body 531c extends in the forward-rearward direction in the first state (i.e. in the upward-downward direction in the second state), rather than in the leftward-rightward direction. The rail body 531c includes a first part 531c1 defining the upper surface in the first state and a second part 531c2 bent downward from the first part 531c1 in the first state in the leftward-rightward direction.

The first part 531c1 extends in the forward-rearward direction in the first state. The first part 531c1 is fixed to the lower surface of the base cabinet 31 in the first state. The side end of the first part 531c1 in the leftward-rightward direction is connected to the second part 531c2.

The second part 531c2 extends in the forward-rearward direction in the first state. The rail body 531c may include a pair of second parts 531c2 disposed in the leftward-rightward direction of the first part 531c1. The upper end of the second part 531c2 in the first state is connected to the side end of the first part 531c1.

The lower side of the rail body 531c is open in the first state to define a groove, which is concave upward. The groove extends in the direction in which the first part 531c1 and the second parts 531c2 extend. The slide 537 may move along the groove defined by the first part 531c1 and the second parts 531c2.

The rail fixing part 531d is disposed at the upper side of the rail body 531c in the first state. The rail fixing part 531d is disposed at the first part 531c1. A plurality of rail fixing parts 531d may be arranged at intervals. A plurality of rail fixing parts 531d may be arranged at intervals in the forward-rearward direction in the first state. In this embodiment, three rail fixing parts 531d are formed at the rail body 531c.

The rail fixing part 531d in the first state will be described in more detail. The rail fixing part 531d has a groove, which is concave upward from the lower surface of the first part 531c1. A head (e.g. a bolt head) of the fastening member may be located in the groove. FIG. 6A shows the rail fixing part 531d after the fastening member is coupled, and FIG. 6B shows the rail fixing part 531d before the fastening member is coupled. The fastening member is located in the rail fixing part 531d to fasten the rail body 531c to the base cabinet 31.

The rail fixing part 531d has a shape protruding from the upper surface of the first part 531c1. Referring to FIGS. 20 to 22, a portion of the first part 531c1 protrudes upward in a circular shape to form the rail fixing part 531d, when viewed from above. The groove, which is concave along the protruding shape of the rail fixing part 531d, may be formed in the upper surface of the disposition part 31a.

Each of the first rail part 531a and the second rail part 531b may be a hole or a groove formed by the rail body 531c. The first rail part 531a and the second rail part 531b extend in the upward-downward direction in the second state. A pair of first rail parts 531a may be disposed at opposite sides of the slide 537. A pair of second rail parts 531b may be disposed at opposite sides of the slide 537. In the second state, the lower portion of the first rail part 531a and the lower portion of the second rail part 531b are disposed parallel to each other. In the second state, the upper portion and the lower portion of the first rail part 531a are straight. In the second state, the upper portion of the second rail part 531b is curved rearward. In the second state, the upper end of the second rail part 531b is disposed in the same vertical plane as the first rail part 531a.

The rail body 531c is provided in the middle thereof with a space in which a slide body 537c is movable. In the second state, the groove, formed in the rail body 531c from the rear to the front thereof so as to be concave, extends in the upward-downward direction. In the second state, the slide body 537c is movable along the groove in the rail body 531c in the upward-downward direction.

The slide 537 includes a first slide part 537a configured to slide along the first rail part 531a and a second slide part 537b configured to slide along the second rail part 531b. The slide 537 includes a slide body 537c, to which the first slide part 537a and the second slide part 537b are fixed. The first slide part 537a is inserted into the first rail part 531a to slide along the first rail part 531a. The second slide part 537b is inserted into the second rail part 531b to slide along the second rail part 531b.

The first slide part 537a and the second slide part 537b protrude in the leftward-rightward direction of the slide body 537c. In the second state, the first slide part 537a and the second slide part 537b are spaced apart from each other in the upward-downward direction. In the second state, the first slide part 537a and the second slide part 537b are disposed respectively at the upper portion and the lower portion of the slide body 537c.

The link body 51 rotates relative to the slide 537, and at the same time the slide 537 rotates relative to the base module 30. The slide 537 rotates relative to the base module 30, and at the same time slides along the rail 531. The link body 51 rotates relative to the base module 30 in one direction by the rotary part 535, the rail 531, and the slide 537, and at the same time the slide 537 slides along the rail 531 while rotating relative to the base module 30 in the opposite direction.

The slide body 537c is disposed so as to be rotatable relative to the base module 30. The rotation of the slide body 537c relative to the base module 30 is achieved through the guiding operation of the first rail part 531a and the second rail part 531b. The slide body 537c is disposed so as to rotate relative to the rail 531 about the first slide part 537a when the link body 51 rotates relative to the slide 537.

Specifically, the second slide part 537b moves such that the direction in which the link body 51 rotates relative to the rail 531 and the direction in which the slide 537 rotates relative to the rail 531 are opposite to each other. The second slide part 537b slides while rotating such that the direction in which the link body 51 rotates relative to the rail 531 and the direction in which the slide 537 rotates relative to the rail 531 are opposite to each other. The second rail part 531b is curved in the vertical plane along the moving track of the second slide part 537b. FIGS. 20 to 22 show a portion 531bc of the second rail part 531b, which is curved in the vertical plane along the moving track of the second slide part 537b.

Specifically, the second rail part 531*b* has a groove or a hole for guiding the slide 537. The groove or the hole for guiding the slide 537 is curved in the vertical plane. The shape of the groove or the hole for guiding the slide 537 forms a track for guiding the slide 537. In the first state, the portion 531*bc* of the second rail part 531*b* includes a portion at which the guiding track is curved upward from the rear to the front thereof. In the first state, the portion 531*bc* of the second rail part 531*b* is formed such that the guiding track is curved upward from the rear to the front thereof and is then curved forward. In the second state, the portion 531*bc* of the second rail part 531*b* includes a portion at which the guiding track is curved forward from the upper end to the lower end thereof. In the second state, the portion 531*bc* of the second rail part 531*b* is formed such that the guiding track is curved forward from the upper end to the lower end thereof and is then curved downward.

The first connection unit 53 may include a curved part 533 extending while being curved forward from the link body 51 to the rotary part 535 in the first state. The curved part 533 extends from the lower end of the link body 51. In the first state, the curved part 533 is disposed at the rear end of the lower side of the base module 30. In the second state, the rear surface of the link body 51 is disposed in the same vertical plane as the rear surface of the base module 30. In the second state, the curved part 533 is inserted into the middle groove of the rail body 531*c* together with the slide body 537*c*. In the second state, the rotary part 535 is disposed further forward than the rear surface of the link body 51. In the second state, the slide body 537*c* slides in the upward-downward direction while the upper portion of the slide body 537*c* remains inclined forward.

Although not shown, in a further embodiment, the length of the link body 51 may be variable, in which case the rail 531 and the slide 537 need not be provided. In the first state, the length of the link body 51 may be increased. In the second state, the length of the link body 51 may be decreased. When the length of the link body 51 is decreased in the second state, the lower portion of the display module 10 may come into contact with the upper portion of the base module 30 in the second state.

A structure for fixing the display apparatus in the second state to a wall will be described with reference to FIGS. 15 to 19B.

The display apparatus includes hanging parts 10*a* and 31*a* for fixing the display apparatus to a wall in the second state. The display apparatus includes a wall-mounting auxiliary member 70 fixed to the wall for fixing the hanging parts 10*a* and 31*a*. The hanging parts 10*a* and 31*a* may be formed at the display module 10 and the base module 30, respectively. The wall-mounting auxiliary member 70 includes a first wall-mounting auxiliary member 71 coupled to the display module 10 and a second wall-mounting auxiliary member 72 coupled to the base module 30.

The hinge fixing member 15 is provided with a display hanging part 10*a* for fixing the display module to the wall in the second state. The display hanging part 10*a* has a recess, which is concave upward. A plurality of display hanging parts 10*a* may be arranged along the hinge fixing member 15 at intervals. The display hanging parts 10*a* may be arranged at intervals in the leftward-rightward direction.

The first wall-mounting auxiliary member 71 includes a first board 71*d* configured to contact the wall. The first board 71*d* includes a fixing part configured to be fixed to the wall. The first board 71*d* may be form in the shape of a plate having a predetermined thickness in the forward-rearward direction.

The first wall-mounting auxiliary member 71 includes a first protrusion 71*b* protruding forward from the first board 71*d*. The first protrusion 71*b* may be circular when viewed from the front. The first protrusion 71*b* is provided in the center thereof with a hole 71*c* extending in the forward-rearward direction. The rear end of the first protrusion 71*b* is connected to the first board 71*d*. The hole 71*c* is formed through the first protrusion 71*b* and the first board 71*d*.

The first wall-mounting auxiliary member 71 includes a first insertion part 71*a* configured to be inserted into the display hanging part 10*a*. The first insertion part 71*a* includes an upward protrusion configured to be inserted into the display hanging part 10*a*. The first insertion part 71*a* is connected to the front portion of the first protrusion 71*b*. The first protrusion 71*b* may be bent upward from the front end thereof and may then extend. The first insertion part 71*a* may be formed as the front end of the first protrusion 71*b* extends in the vertical plane. When viewed from the front, the first protrusion 71*b* may be circular. When viewed from the front, the circumference of the first insertion part 71*a* is larger than that of the first protrusion 71*b*. The hole 71*c* may be formed through the center of the first insertion part 71*a*. The hole may extend in the upward, downward, leftward, and rightward directions. The upper portion of the hole becomes the first insertion part 71*a*. The first insertion part 71*a* may be disposed at the lower side of the display hanging part 10*a*. The first insertion part 71*a* is disposed at a position corresponding to the display hanging part 10*a*. A plurality of first insertion parts 71*a* may be disposed at positions corresponding to the display hanging parts 10*a*.

Base hanging parts 31*d* and 31*f* for fixing the base module to the wall in the second state are formed in the rear portion of the base module 30 in the second state.

The base hanging parts 31*d* and 31*f* may include a slit 31*d* extending in the upward-downward direction. The base hanging parts 31*d* and 31*f* may include a pair of left and right slits 31*d*. The width of the upper portion of each of the slits 31*d* is smaller than that of the lower portion of each of the slits 31*d*. The inner sides of the slits 31*d* are straight. The lower portions of the outer sides of the slits 31*d* are straight. The upper portions of the outer sides of the slits 31*d* are gradually inclined toward the upper ends thereof so as to be closer to the inner sides thereof. The width of the lower portion of each of the slits 31*d* in the leftward-rightward direction is larger than that of the upper portion of each of the slits 31*d* in the leftward-rightward direction. The width of the upper portion of each of the slits 31*d* in the leftward-rightward direction is gradually decreased toward the upper end thereof.

The base hanging parts 31*d* and 31*f* include a protrusion guide 31*f* for guiding the movement of a second protrusion 72*b*, a description of which will follow, in the upward-downward direction. The protrusion guide 31*f* extends in the upward-downward direction. The protrusion guide 31*f* protrudes forward. The protrusion guide 31*f* extends along the edge of the slit 31*d* in the upward-downward direction. A pair of protrusion guides 31*f* is disposed in the inner sides of the slits 31*d*. The protrusion guide 31*f* may have a rib shape protruding into the base cabinet 31 and extending in the upward-downward direction. The protrusion guides 31*f* are parallel to each other.

The second wall-mounting auxiliary member 72 includes a second board 72*d* configured to contact the wall. The second board 72*d* includes a wall fixing part 72*e* configured to be fixed to the wall. The second board 72*d* may be formed in the shape of a plate having a predetermined thickness in the forward-rearward direction.

The second wall-mounting auxiliary member 72 includes a second protrusion 72*b* protruding forward from the second board 72*d*. The second protrusion 72*b* may be bent forward from the second board 72*d*. The second board 72*d* is cut along three sides of an imaginary quadrangle, and the portion of the second board 72*d* corresponding to the imaginary quadrangle is bent forward about the other side of the imaginary quadrangle to form the second protrusion 72*b*. As a result, a hole 72*c* is formed in the portion of the second board 72*d* corresponding to the imaginary quadrangle before bending. A pair of second protrusions 72*b* is disposed at positions corresponding to the slits 31*d*. The second protrusions 72*b* are disposed such that the distance between the second protrusions 72*b* is gradually decreased toward the upper ends thereof. The distance between the upper ends of the second protrusions 72*b* corresponds to the distance between the slits 31*d*. The length of the second protrusions 72*b* in the upward-downward direction is smaller than the length of the slits 31*d* in the upward-downward direction.

The second protrusion 72*b* may move relative to the base cabinet 31 along the protrusion guide 31*f* in the upward-downward direction.

The second wall-mounting auxiliary member 72 includes a bent part 72*a* configured to be inserted into the display hanging part 10*a* together with the second protrusion 72*b*. The bent part 72*a* is connected to the front portion of the second protrusion 72*b*. The bent part 72*a* may be bent from the front end of the second protrusion 72*b* in the leftward-rightward directions, and may extend. A pair of bent parts 72*a* is disposed at positions corresponding to the slits 31*d*. The bent parts 72*a* are connected respectively to the second protrusions 72*b*, are bent outward, and extend. The distance between the second protrusions 72*b* is gradually decreased toward the upper ends of the second protrusions 72*b*. The second protrusions 72*b* and the bent parts 72*a* are inclined so as to become closer to each other toward the upper ends thereof. The length of the bent parts 72*a* in the upward-downward direction is smaller than the length of the slits 31*d* in the upward-downward direction.

The second protrusions 72*b* may be inserted into the slits 31*d* from the lower portions of the slits 31*d* in the forward-rearward direction. The second protrusions 72*b* may be withdrawn from the slits 31*d* from the lower portions of the slits 31*d* in the forward-rearward direction. When the bent parts 72*a* move upward along the slits 31*d* (see an arrow A of FIG. 18B), the second protrusions 72*b* are caught by the base cabinet 31 at the upper portions of the slits 31*a* (see FIG. 18C). The bent parts 72*a* are caught by the base cabinet 31 such that the bent parts 72*a* are not withdrawn from the upper portions of the slits 31*d* in the forward-rearward direction. In this case, the upper ends of the second protrusions 72*b* come into contact with the upper ends of the slits 31*d* to limit the upward movement of the second protrusions 72*b* and the bent parts 72*a* relative to the base cabinet 31.

The second wall-mounting auxiliary member 72 is tightly attached to the wall. The second wall-mounting auxiliary member 72 includes a wall fixing part 72*e* for fixing the second wall-mounting auxiliary member 72 to the wall. The wall fixing part 72*e* may be a screw. In this embodiment, the wall fixing part 72*e* is disposed between the second protrusions 72*b*. A plurality of wall fixing parts 72*e* may be disposed so as to be spaced apart from each other in the leftward-rightward direction. In this case, the second protrusions 72*b* may be disposed between the wall fixing parts 72*e*, spaced apart from each other in the leftward-rightward direction. One of the second protrusions 72*b* may be disposed between the wall fixing parts 72*e*, spaced apart from each other in the leftward-rightward direction. The wall fixing part 72*e* may include a hole formed in the second board 72*d*. The wall fixing part 72*e* may include a fastening member configured to be inserted into the hole to fasten the second board 72*d* to the wall.

The display apparatus may include a stopper (not shown) for limiting the rotational angle of the first connection unit 53. The display apparatus may include a stopper (not shown) for limiting the rotational angle of the second connection unit 55. The display apparatus may include a locking device (not shown) for locking the display module 10, the base module 30, and the link module 50 in the first state and the second state so that they do not move relative to each other. The display panel 11 may be rotatable only when the locking device is released.

As is apparent from the above description, in the display apparatus according to the present invention, the state of the display module is switched between the first state and the second state, and the distance between the rear surface of the display module and the wall is minimized in the second state, in which the display apparatus is mounted to the wall.

In addition, the rigidity of the display module in the first state is increased by the provision of the link module, thereby preventing the display module from being curved rearward.

In addition, it is possible for the user to easily switch the state of the display apparatus between the first state and the second state using the link module.

In addition, the base module is disposed so as to be exposed forward even in the second state such that the input unit provided at the base module can be easily manipulated, such that sound can be more smoothly output through the speaker installed in the base module, and such that the communication unit installed in the base module can better receive an external signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
   a display module;
   a base module configured to be rotatable about a first rotational axis extending in a leftward-rightward direction,
   a first connection unit connected to the base module so as to be rotatable about the first rotational axis;
   a second connection unit connected to the rear portion of the display module so as to be rotatable about a second rotational axis extending in the leftward-rightward direction; and
   a link body disposed to interconnect the first connection unit and the second connection unit, wherein
   the display apparatus is configured to have a first state, in which the base module is configured to be placed on a floor to support the display module, and a second state, in which the base module is rotated by a predetermined angle from the first state,
   the first rotational axis is disposed at a rear portion of the base module in the second state,
   the rear portion faces upward or downward in the first state, and
   the first connection unit comprises:
   a rail fixed to the base module, the rail extending in forward-rearward direction in the first state;

a slide configured to be movable along the rail; and
a rotary part disposed between the slide and the link body for enabling the slide and the link body to be rotatable relative to each other about the first rotational axis.

2. The display apparatus according to claim 1, wherein the rear portion faces downward and the first rotational axis is disposed at a rear-lower side of the base module in the first state.

3. The display apparatus according to claim 1, wherein the rear portion faces upward and the first rotational axis is disposed at a rear-upper side of the base module in the first state.

4. The display apparatus according to claim 1, wherein the second connection unit rotates the link body such that the link body becomes closer to a rear surface of the display module in the second state than in the first state.

5. The display apparatus according to claim 1, wherein the display module comprises:
a display panel;
a panel support member coupled to a rear side of the display panel; and
a hinge fixing member fixed to the panel support member, the hinge fixing member being connected to the second connection unit.

6. The display apparatus according to claim 5, wherein
the hinge fixing member is provided with a display hanging part for fixing the display module in the second state to a wall, and
the base module is provided in the rear portion thereof with a base hanging part for fixing the base module in the second state to the wall.

7. The display apparatus according to claim 1, wherein a position of the first rotational axis relative to the base module is changeable.

8. The display apparatus according to claim 1, wherein the link module is slidable relative to the base module.

9. The display apparatus according to claim 1, wherein a position of the first rotational axis relative to the base module is changeable via sliding along the rear portion of the base module.

10. The display apparatus according to claim 1, wherein the rail comprises a first rail part and a second rail part spaced apart from each other in the vertical plane, and
the slide comprises:
a first slide part configured to slide along the first rail part;
a second slide part configured to slide along the second rail part; and
a slide body, to which the first slide part and the second slide part are fixed, the slide body being configured to rotate relative to the rail about the first slide part when the link body rotates relative to the slide.

11. The display apparatus according to claim 10, wherein
the second slide part moves such that a direction in which the link body rotates relative to the rail and a direction in which the slide rotates relative to the rail are opposite to each other, and
the second rail part is curved in the vertical plane along a moving track of the second slide part.

12. The display apparatus according to claim 1, wherein
the rear portion of the base module faces downward in the first state, and
the first connection unit further comprises a curved part extending while being curved forward from the link body to the rotary part in the first state.

13. The display apparatus according to claim 1, wherein a portion of the display module and a portion of the base module that contact each other in the first state are separated from each other in the second state.

14. The display apparatus according to claim 1, wherein
the display module comprises a reception connection terminal for receiving an image signal,
the base module comprises:
a base cabinet defining an external appearance thereof;
a control unit provided in the base cabinet for controlling the image signal of the display module; and
a transmission connection terminal configured to contact the reception connection terminal for transmitting the image signal from the control unit to the display module, and
the transmission connection terminal comprises:
a first transmission connection terminal configured to contact the reception connection terminal in the first state; and
a second transmission connection terminal configured to contact the reception connection terminal in the second state.

* * * * *